(12) United States Patent
Bunsen et al.

(10) Patent No.: US 9,360,508 B2
(45) Date of Patent: Jun. 7, 2016

(54) DETECTING DEVICE, POWER RECEIVING DEVICE, CONTACTLESS POWER TRANSMISSION SYSTEM, AND DETECTING METHOD

(71) Applicant: SONY CORPORATION, Tokyo (JP)

(72) Inventors: Keigo Bunsen, Tokyo (JP); Hiroaki Nakano, Tokyo (JP); Tomomichi Murakami, Tokyo (JP); Shinichi Fukuda, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 505 days.

(21) Appl. No.: 13/671,062

(22) Filed: Nov. 7, 2012

(65) Prior Publication Data
US 2013/0134792 A1 May 30, 2013

(30) Foreign Application Priority Data
Nov. 30, 2011 (JP) .................. 2011-261816

(51) Int. Cl.
G01R 27/04 (2006.01)
H01F 38/14 (2006.01)
H02J 5/00 (2016.01)
H02J 7/02 (2016.01)

(52) U.S. Cl.
CPC ............... *G01R 27/04* (2013.01); *H01F 38/14* (2013.01); *H02J 5/005* (2013.01); *H02J 7/025* (2013.01)

(58) Field of Classification Search
CPC ...... H02J 5/005; H04B 5/0075; H04B 5/0037
USPC .......................................... 307/104
See application file for complete search history.

(56) References Cited

U.S. PATENT DOCUMENTS

| 2011/0074346 | A1 | 3/2011 | Hall et al. |
| 2012/0001493 | A1* | 1/2012 | Kudo et al. ............ 307/104 |

FOREIGN PATENT DOCUMENTS

| EP | 2573902 | 3/2013 |
| JP | HEI03098418 A | 4/1991 |
| JP | 2001-275280 | 10/2001 |
| JP | 2008-206231 | 9/2008 |
| JP | 2010-164472 A | 7/2010 |
| JP | 2011-120410 A | 6/2011 |

OTHER PUBLICATIONS

Extended European Search Report for related EP application No. 12 007882 dated Apr. 26, 2013.

* cited by examiner

*Primary Examiner* — Rexford Barnie
*Assistant Examiner* — Thai Tran
(74) *Attorney, Agent, or Firm* — Chip Law Group

(57) ABSTRACT

Disclosed herein is a detecting device including a coil electromagnetically coupled to the external, a resonant circuit that includes at least the coil, and a detecting section that superimposes a measurement signal for measuring the Q-factor of the resonant circuit on a power transmission signal transmitted to the coil in a contactless manner and removes the power transmission signal from an alternating-current signal obtained by superimposing the measurement signal on the power transmission signal. The detecting section measures the Q-factor by using the alternating-current signal from which the power transmission signal is removed.

19 Claims, 16 Drawing Sheets

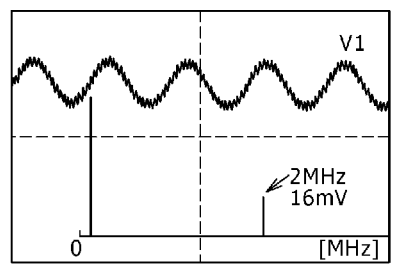
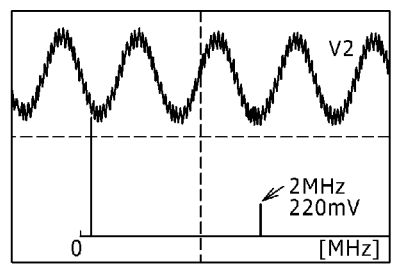
FIG.7A     FIG.7B
FIG.8
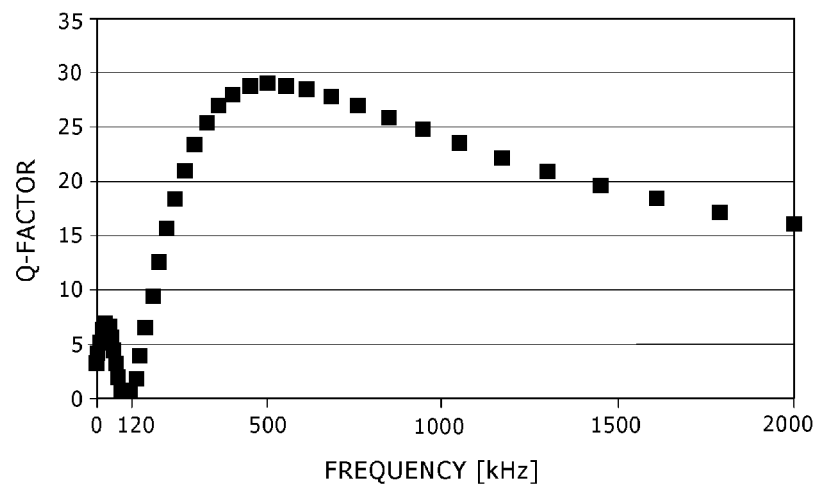

DETECTING DEVICE, POWER RECEIVING DEVICE, CONTACTLESS POWER TRANSMISSION SYSTEM, AND DETECTING METHOD

BACKGROUND

The present disclosure relates to a detecting device, a power receiving device, a contactless power transmission system, and a detecting method to detect the existence of a conductor such as a metal.

In recent years, the contactless power transmission system to supply power in a contactless manner (wireless power feed) is being actively developed. As the system to realize the wireless power feed, two kinds of techniques exist in a rough classification.

One is the electromagnetic induction system, already widely known. In the electromagnetic induction system, the degree of coupling between the power transmission side and the power reception side is very high and power feed with high efficiency is possible. However, the coupling coefficient between the power transmission side and the power reception side needs to be kept high. Therefore, the power transmission efficiency between the coils of the power transmission side and the power reception side (hereinafter, referred to as the "inter-coil efficiency") greatly deteriorates when the distance between the power transmission side and the power reception side is long or when there is positional misalignment.

The other is the technique called the magnetic resonance system. It has a characteristic that the resonance phenomenon is aggressively utilized and thereby even little magnetic flux is permitted as the magnetic flux shared by the power feed source and the power feed target. In the magnetic resonance system, even when the coupling coefficient is small, the inter-coil efficiency does not deteriorate if the quality factor (Q-factor) is high. The Q-factor is an index representing the relationship between retention and loss of energy in a circuit having the coil of the power transmission side or the power reception side (indicating the intensity of the resonance of a resonant circuit). That is, axis alignment between the transmission-side coil and the reception-side coil is unnecessary and flexibility in the position and distance of the power transmission side and the power reception side is high.

One of the important factors in the contactless power transmission system is countermeasures against heat generation of a metal foreign substance. Whether the system is the electromagnetic induction system or the magnetic resonance system, in contactless power feed, if a metal exists between the power transmission side and the power reception side, possibly an eddy current is generated in the metal and heat generation of the metal is caused. As countermeasures against this heat generation, a large number of techniques to detect the metal foreign substance have been proposed. For example, techniques using an optical sensor or a temperature sensor are known. However, in the detecting method using a sensor, the cost is high when the power feed range is wide like in the magnetic resonance system. Furthermore, for example, in the case of the temperature sensor, the output result of the temperature sensor depends on the thermal conductivity of the environments around it, which imposes design restrictions on the pieces of apparatus of the power transmission side and the power reception side.

To address this, the following technique has been proposed. Specifically, whether or not a metal foreign substance is present is determined by monitoring change in a parameter (current, voltage, etc.) when the metal foreign substance encroaches between the power transmission side and the power reception side. Such a technique can suppress the cost without the necessity to impose design restrictions and so forth. For example, Japanese Patent Laid-open No. 2008-206231 (Patent Document 1) proposes a method in which a metal foreign substance is detected based on the degree of modulation (information on change in the amplitude and phase) in the communication between the power transmission side and the power reception side. Furthermore, Japanese Patent Laid-open No. 2001-275280 (Patent Document 2) proposes a method in which a metal foreign substance is detected based on the eddy current loss (foreign substance detection based on the DC (direct current)-DC efficiency).

SUMMARY

However, in the techniques proposed by Patent Documents 1 and 2, the influence of a metal chassis of the power reception side is not taken into consideration. Considering a charge to general portable apparatus, the possibility that some kind of metal (metal chassis, metal parts, etc.) is used in the portable apparatus is high and it is difficult to discriminate whether change in a parameter is due to "the influence of a metal chassis or the like" or due to "interfusion of a metal foreign substance." For example, in the case of Patent Document 2, it is unclear whether the eddy current loss is caused in the metal chassis of portable apparatus or is caused due to interfusion of a metal foreign substance between the power transmission side and the power reception side. As just described, it cannot be deemed that the techniques proposed by Patent Documents 1 and 2 are capable of detecting a metal foreign substance with high accuracy.

There is a need for the present disclosure to detect a metal foreign substance existing near a coil without newly providing a sensor and enhance the accuracy of the detection.

According to an embodiment of the present disclosure, there is provided a detecting device including: a coil configured to be electromagnetically coupled to an external; a resonant circuit configured to include at least the coil; and a detecting section configured to superimpose a measurement signal for measuring a Q-factor of the resonant circuit on a power transmission signal transmitted to the coil in a contactless manner and remove the power transmission signal from an alternating-current signal obtained by superimposing the measurement signal on the power transmission signal, the detecting section measuring the Q-factor by using the alternating-current signal from which the power transmission signal is removed.

According to another embodiment of the present disclosure, there is provided a power receiving device including: a coil configured to be used to receive power from an external; a resonant circuit configured to include at least the coil; and a detecting section configured to superimpose a measurement signal for measuring a Q-factor of the resonant circuit on a power transmission signal transmitted to the coil in a contactless manner and remove the power transmission signal from an alternating-current signal obtained by superimposing the measurement signal on the power transmission signal, the detecting section measuring the Q-factor by using the alternating-current signal from which the power transmission signal is removed.

According to still another embodiment of the present disclosure, there is provided a contactless power transmission system including a power transmitting device that wirelessly transmits power and a power receiving device that receives power from the power transmitting device, the power receiving device including: a coil configured to be used to receive power from an external; a resonant circuit configured to include at least the coil; and a detecting section configured to superimpose a measurement signal for measuring a Q-factor of the resonant circuit on a power transmission signal transmitted to the coil in a contactless manner and remove the power transmission signal from an alternating-current signal obtained by superimposing the measurement signal on the power transmission signal, the detecting section measuring the Q-factor by using the alternating-current signal from which the power transmission signal is removed.

According to a further embodiment of the present disclosure, there is provided a detecting method including: superimposing a measurement signal for measuring a Q-factor of a resonant circuit including at least a coil on a power transmission signal transmitted to the coil in a contactless manner by a detecting section included in a detecting device; removing the power transmission signal from an alternating-current signal obtained by superimposing the measurement signal on the power transmission signal; and measuring the Q-factor by using the alternating-current signal from which the power transmission signal is removed.

According to the embodiments of the present disclosure, a metal foreign substance existing near the coil can be detected without newly providing a sensor and the accuracy of the detection is enhanced.

Furthermore, detection of a metal foreign substance with high accuracy can be realized on the secondary side without stopping power transmission from the primary side to the secondary side.

BRIEF DESCRIPTION OF THE DRAWINGS

FIG. 7A is a graph showing a spectrum characteristic example of the voltage V1 and FIG. 7B is a graph showing a spectrum characteristic example of the voltage V2;

FIG. 8 is a graph showing an example of the relationship between the frequency and the Q-factor when the Q-factor of a power receiving coil is measured by using an LCR (inductance-capacitance-resistance) meter;

DETAILED DESCRIPTION OF THE PREFERRED EMBODIMENTS

Examples of modes for carrying out the present disclosure will be described below with reference to the accompanying drawings. In the present specification and the drawings, the constituent element substantially having the same function or configuration is given the same numeral and thereby overlapping description is omitted.

The description will be made in the following order.
1. Introduction
2. First Embodiment (detecting section: example including a resonant frequency adjuster and a first frequency remover)
3. Second Embodiment (separator: example in which a separator is provided on the load side of a resonant circuit)
4. Third Embodiment (frequency remover: example in which a second frequency remover is provided instead of a separator)
5. Others 1. Introduction Embodiments of the present disclosure are a technique of measuring the quality factor (Q-factor) of a circuit including a coil electromagnetically coupled to the external when power is fed from the power transmission side (primary side) to charge the power reception side (secondary side), and determining whether or not a metal foreign substance near the coil is present based on the measurement result of the Q-factor.

The Q-factor is an index representing the relationship between retention and loss of energy and is generally used as a value representing the sharpness of the peak of the resonance (intensity of the resonance) of a resonant circuit.

The metal foreign substance covers a conductor such as a metal existing between the power transmission side and the power reception side and a circuit including an unintended coil. Conductors in a broad sense, i.e. semiconductors, are also encompassed in the conductor in the present specification. Hereinafter, detecting a conductor such as a metal and a circuit including a coil will be expressed also as "detecting a conductor and so forth."

[Principle of Q-Factor Measurement]

The principle of the Q-factor measurement will be described below with reference to drawings.

Figure 1:
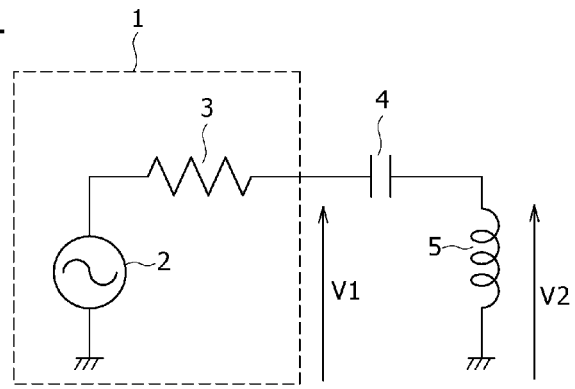
FIG. 1 is a schematic circuit diagram for explaining Q-factor measurement used for detection of a metal foreign substance in an embodiment of the present disclosure.

FIG. 1 is a schematic circuit diagram for explaining the Q-factor measurement used to detect a metal foreign substance in the embodiments of the present disclosure.

The circuit shown in FIG. 1 is one example of the most basic circuit configuration representing the measurement principle of the Q-factor (in the case of magnetic field coupling). Although FIG. 1 shows a circuit including a series resonant circuit composed of a coil 5 and a capacitor 4, various modes will be available as the mode of the detailed configuration as long as the configuration has the function of the resonant circuit. The Q-factor measurement of this resonant circuit is a technique used also in a measurement instrument (LCR meter).

If e.g. a metal piece exists near the coil 5 as a metal foreign substance, magnetic field lines pass through the metal piece and an eddy current is generated in the metal piece. This looks, from the viewpoint of the coil 5, as if the metal piece is electromagnetically coupled to the coil 5 and a resistive load is imposed on the coil 5, and changes the Q-factor of the coil (resonant circuit). Measuring this Q-factor leads to detection of a metal foreign substance (in the electromagnetically-coupled state) existing near the coil 5.

The circuit used for the Q-factor measurement shown in FIG. 1 includes a signal source 1 including an alternating-current (AC) power supply 2 that generates an AC signal (sine wave) and a resistive element 3, the capacitor 4, and the coil 5. The resistive element 3 is equivalent to diagrammatic representation of the internal resistance (output impedance) of the AC power supply 2. The capacitor 4 and the coil 5 are connected to the signal source 1 in such a manner as to form a series resonant circuit (one example of the resonant circuit). Furthermore, the value of the capacitance (C value) of the capacitor 4 and the value of the inductance (L value) of the coil 5 are adjusted so that the resonant circuit may resonate at the frequency desired to be measured.

If the voltage between both ends of the coil 5 and the capacitor 4 configuring the series resonant circuit is defined as V1 (one example of the voltage applied to the resonant circuit) and the voltage between both ends of the coil 5 is defined as V2, the Q-factor of this series resonant circuit is represented by expression (1). R denotes the series resistance value at a frequency f. L denotes the inductance value and C denotes the capacitance value. When a relationship of voltage V2>>voltage V1 is satisfied, the expression can be approximately represented.

$$Q = \frac{1}{R}\sqrt{\frac{L}{C}} = \frac{V2 - V1}{V1} \cong \frac{V2}{V1} \quad (1)$$

The voltage V2 is obtained by multiplication of the voltage V1 by about Q. It is known that the series resistance value R and the inductance value L shown in expression (1) change due to the influence of the approach of a metal or an eddy current generated in a metal. For example, when a metal piece approaches the coil 5, the effective resistance value R becomes larger and the Q-factor decreases. That is, the Q-factor and resonant frequency of the resonant circuit greatly change due to the influence of the metal existing around the coil 5. Therefore, by detecting this change, the metal piece existing near the coil 5 can be detected. Furthermore, this Q-factor measurement can be applied to detection of a metal foreign substance inserted between the primary side and the secondary side.

By detecting a metal foreign substance by using change in the above-described Q-factor, the metal foreign substance can be removed with high accuracy irrespective of whether the system is the electromagnetic induction system or the magnetic resonance system. In particular, the Q-factor of the coil provided in apparatus of the power reception side (secondary side) allows removal of the influence of a metal chassis on the coil and can be a parameter having high sensitivity to the metal foreign substance because the positional relationship between the metal chassis of the apparatus of the power reception side and this coil is almost fixed. That is, the Q-factor of the power reception side is suitable for detection of the metal foreign substance.

[Outline of Present Disclosure]

However, when foreign substance detection by the Q-factor measurement is applied to the secondary side, the power transmission signal from the primary side is an obstacle to accurate measurement of the Q-factor of the secondary-side coil. If power feed (output of the power transmission signal) from the primary side is being performed at the time of Q-factor measurement, high power is generated in the coil of the secondary side due to the magnetic field output from the primary side, which precludes normal measurement of the voltage V2 of the Q-factor measurement signal and so forth.

The Q-factor of the secondary-side coil is measured by using the technique shown in FIG. 1 and applying a voltage (Q-factor measurement signal) to the resonant circuit composed of this secondary-side coil and a capacitor. If this measurement is performed when power is being transmitted from the primary side, a voltage is generated in the secondary-side coil due to the power transmission from the primary side. This results in an error in the Q-factor measurement. In general, the power transmission is performed with high power and therefore the amplitude of the power transmission signal is much larger compared with the Q-factor measurement signal. Thus, the measurement of the Q-factor cannot be accurately performed.

Therefore, to avoid this, the power transmission from the primary side to the secondary side needs to be stopped via a complicated control flow and the Q-factor of the secondary side needs to be measured with the power transmission stopped. For this purpose, a communication system and control to perform communication between the primary side and the secondary side and send a power transmission stop signal for every measurement of the Q-factor of the secondary side are necessary. This causes problems of increase in the complexity of the control flow and hardware of the power transmitting device and the power receiving device and increase in redundant time in the Q-factor measurement attributed to it.

Furthermore, for example, also when plural power receiving devices exist for one power transmitting device, every time the Q-factor of one power receiving device is measured, even power feed to the other power receiving devices needs to be stopped.

To address such a problem, it will be effective to employ a method to realize foreign substance detection by Q-factor measurement in power feed by an improvement relating to the coil, such as providing a coil for Q-factor measurement separately from the power receiving coil or increasing the number of turns of the power receiving coil. However, possibly this method adversely affects the flexibility in the design of the apparatus of the power reception side and the cost after all.

So, the present disclosure proposes a technique to measure the Q-factor on the secondary side without stopping power transmission on the primary side. In this technique, a Q-factor measurement signal is superimposed on a power transmission carrier (power transmission signal) with a frequency different from that of the transmission carrier and only the Q-factor measurement signal is extracted in Q-factor measurement (voltage measurement). Based on this, the Q-factor measurement is performed simultaneously with the power transmission from the primary side.

2. First Embodiment

In embodiments of the present disclosure, on an AC signal fed as power from the power transmission side (hereinafter, referred to as the "power transmission signal"), an AC signal for Q-factor measurement with a frequency different from that of the power transmission signal (hereinafter, referred to as the "Q-factor measurement signal") is superimposed. Furthermore, the Q-factor is measured by using the AC signal obtained by removing the power transmission signal from the AC signal resulting from the combining of two AC signals.

[Configuration Example of Power Receiving Device]

Figure 2:
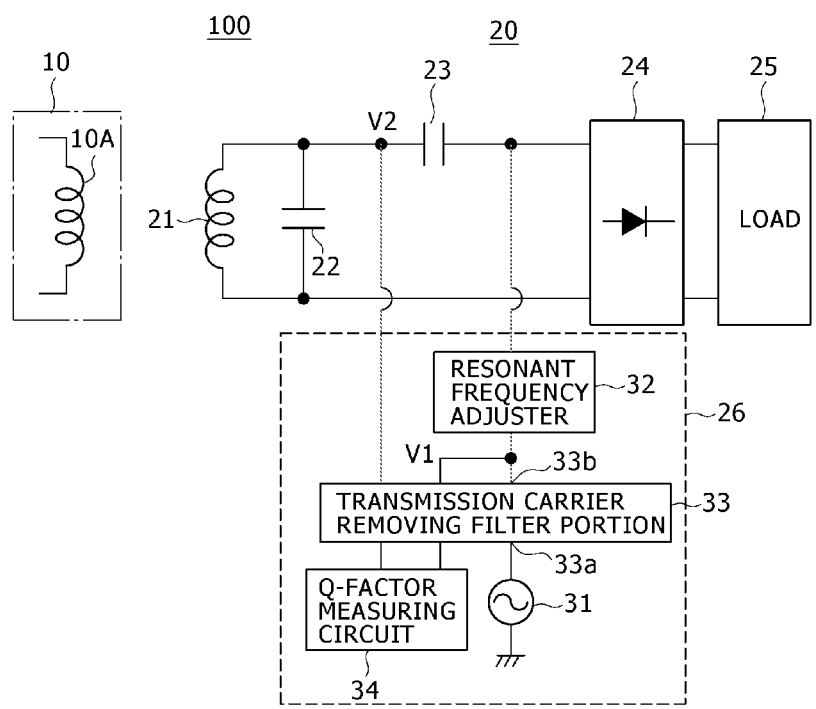
FIG. 2 is a schematic circuit diagram showing a configuration example of a power receiving device in a contactless power transmission system according to a first embodiment of the present disclosure.

FIG. 2 is a schematic circuit diagram showing a configuration example of a power receiving device in a contactless power transmission system according to a first embodiment of the present disclosure.

A contactless power transmission system 100 includes a power transmitting device 10 (primary side) including at least a power transmitting coil 10A and a power receiving device 20 (secondary side). The power receiving device 20 is one example of the detecting device.

The power receiving device 20 includes a power receiving coil 21 (one example of the coil), capacitors 22 and 23, a rectifier 24, a load 25, and a detecting section 26 (one example of the detecting section) as one example.

In the power receiving device 20, one terminal of the power receiving coil 21 and the capacitor 22 connected in parallel is connected to one terminal of the capacitor 23 connected in series to this power receiving coil 21, so that a resonant circuit is configured. This resonant circuit is connected to the load 25 via the rectifier 24. The inductance value (L value) of the power receiving coil 21 and the capacitance value (C value) of the capacitors 22 and 23 are adjusted so that the resonant circuit may resonate at the frequency for Q-factor measurement. The power receiving section is configured by the capacitors 22 and 23 and the rectifier 24.

In the power receiving device 20, an AC magnetic field generated by the power transmitting device 10 is received by the power receiving coil 21 by e.g. a magnetic resonance system and the AC signal is extracted via the resonant circuit including the power receiving coil 21 and the capacitors 22 and 23. The extracted AC signal is converted to a DC signal through rectification and smoothing by the rectifier 24. A constant voltage is generated by utilizing this DC signal by a regulator (not shown) and is supplied to the load 25 such as a battery.

The detecting section 26 is connected to points at both ends of the capacitor 23 and detects the voltage at these points at both ends of the capacitor 23 to measure the Q-factor.

[Configuration Example of Detecting Section]

The detecting section 26 has functions to superimpose the Q-factor measurement signal having a frequency different from that of the power transmission signal on the power transmission signal received via the power receiving coil 21 and measure the Q-factor by using the AC signal obtained by removing the power transmission signal from the AC signal resulting from the combining of two signals. In the AC signal obtained by removing the power transmission signal from the AC signal resulting from the combining of these two AC signals, the Q-factor measurement signal is included.

To realize such a function, the detecting section 26 includes a Q-factor measurement signal source 31, a resonant frequency adjuster 32, a transmission carrier removing filter portion 33, and a Q-factor measuring circuit 34 as one example.

The Q-factor measurement signal source 31 has a function similar to that of the signal source 1 (AC power supply 2) in FIG. 1 and outputs an AC signal for Q-factor measurement at the time of Q-factor measurement. The frequency of the Q-factor measurement signal is set to one different from the frequency (hereinafter, referred to also as the "power transmission frequency") of the power transmission signal (power transmission carrier) transmitted from the power transmission side. This allows separation between the power transmission signal and the Q-factor measurement signal. Thus, power feed and measurement of the Q-factor can be simultaneously performed.

The resonant frequency adjuster 32 is to change the resonant frequency of the resonant circuit of the power receiving device 20. As described above, the power transmission signal can be separated from the Q-factor measurement signal by setting the frequency of the power transmission signal different from that of the Q-factor measurement signal. However, the capacitors 22 and 23 for resonance, connected to the power receiving coil 21, are set to such a value that resonance is performed at the power transmission frequency. Therefore, the resonant frequency adjuster 32 for Q-factor measurement for measuring the Q-factor in the resonant state is used. A capacitor can be applied to the resonant frequency adjuster 32 as one example. However, it is not limited to this example. For example, it may be configured by using a coil different from the power receiving coil or by using a coil and a capacitor.

The transmission carrier removing filter portion 33 is inserted between the Q-factor measurement signal source 31 and the resonant frequency adjuster 32. The purpose of providing the transmission carrier removing filter portion 33 posterior to (on the downstream side of) the Q-factor measurement signal source 31 is to prevent the influence of the Q-factor measurement signal source 31 from being given to the power transmission signal (power transmission carrier). Furthermore, the purpose is also to prevent the Q-factor measurement signal source from being broken by the power transmission signal, in which large amplitude is generated.

Similarly, the transmission carrier removing filter portion 33 is also provided anterior to (on the upstream side of) the Q-factor measuring circuit 34. This is to remove the power transmission signal from the Q-factor measurement signal superimposed on the power transmission signal and measure only the Q-factor measurement signal.

The Q-factor measuring circuit 34 measures the Q-factor by using the AC signal obtained by removing the power transmission signal from the AC signal resulting from the combining of two signals, i.e. the power transmission signal received via the power receiving coil 21 and the Q-factor measurement signal having a frequency different from that of the power transmission signal. Then, the detecting section 26 compares the Q-factor obtained by the Q-factor measuring circuit 34 with a reference value set in advance to thereby determine the state of electromagnetic coupling between the power receiving coil 21 and the external, specifically e.g. the power transmitting coil 10A of the power transmitting device 10, i.e. whether or not a metal foreign substance near the power receiving coil 21 is present.

In this detection processing of a metal foreign substance by the Q-factor measurement, frequency sweep processing to identify the resonant frequency may be executed.

A further description will be made below about the transmission carrier removing filter portion 33. The transmission carrier removing filter portion 33 is so configured that the seen impedance differs depending on the seeing direction.

Figure 3:
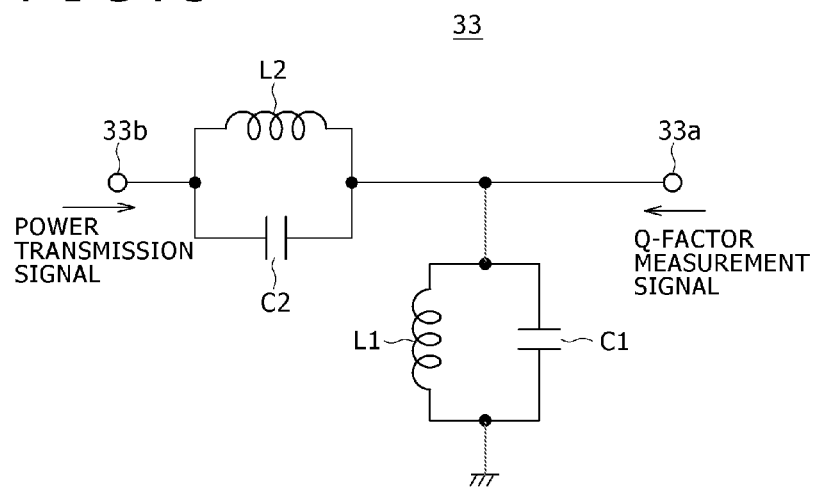
FIG. 3 is a circuit diagram showing part of an internal configuration example of a transmission carrier removing filter portion in FIG. 2.

FIG. 3 is a circuit diagram showing part of an internal configuration example of the transmission carrier removing filter portion 33.

In the example shown in FIG. 3, one terminal of a parallel circuit of a coil L1 and a capacitor C1 is connected to a ground terminal and the other terminal thereof is connected to a terminal 33a on the side of the Q-factor measurement signal source 31. Furthermore, the other terminal of the parallel circuit of the coil L1 and the capacitor C1 is connected to one terminal of a parallel circuit of a coil L2 and a capacitor C2. The other terminal of the parallel circuit of the coil L2 and the capacitor C2 is connected to a terminal 33b on the resonant circuit side, to which the power transmission signal is input.

By this circuit configuration shown in FIG. 3, the Q-factor measurement signal input from the terminal 33a on the side of the Q-factor measurement signal source 31 reaches the terminal 33b on the resonant circuit side (passage). On the other hand, the power transmission signal input from the terminal 33b on the resonant circuit side does not reach the terminal 33a on the side of the Q-factor measurement signal source 31 (block). By appropriately selecting the values of the coils L1 and L2 and the capacitors C1 and C2, the passage or block can be controlled about an AC signal having the desired frequency. In the present example, for example, the frequency of the power transmission signal is set to 120 kHz and the frequency of the Q-factor measurement signal is set to 2 MHz by selecting the values of the coils L1 and L2 and the capacitors C1 and C2.

Figure 4:
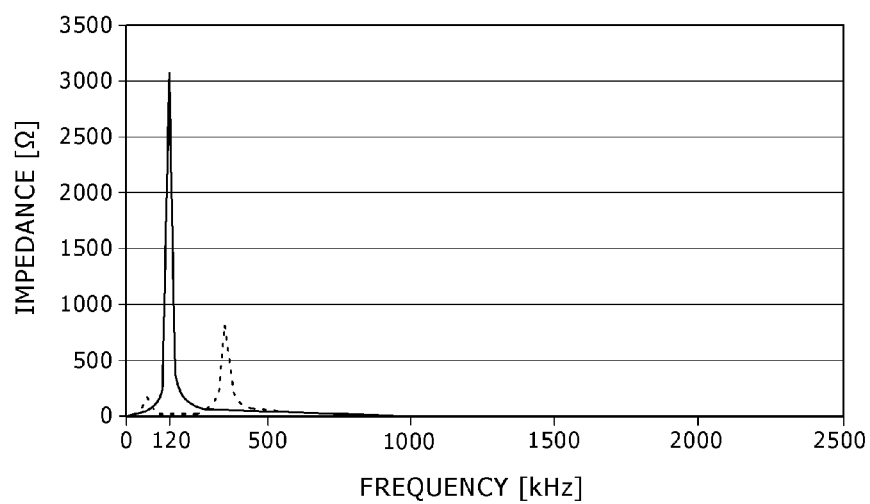
FIG. 4 is a graph showing a frequency characteristic example of the impedance of the transmission carrier removing filter portion of FIG. 3.

FIG. 4 is a graph showing a frequency characteristic example of the impedance about the circuit of the transmission carrier removing filter portion 33 shown in FIG. 3.

The example of FIG. 4 represents the impedance of the transmission carrier removing filter portion 33 seen from the resonant circuit side and from the side of the Q-factor measurement signal source 31.

The impedance seen from the resonant circuit side appears high impedance of 3000Ω or higher near 120 kHz, which is the power transmission frequency (solid characteristic curve). In this case, the Q-factor measurement signal source 31 appears to have no influence for the power transmission signal and does not preclude power feed.

On the other hand, when being seen from the Q-factor measurement signal source 31, the impedance appears low near 2 MHz, which is the frequency for Q-factor measurement (dashed characteristic curve). Thus, it is possible to superimpose the Q-factor measurement signal on the resonant circuit side.

Figure 5:
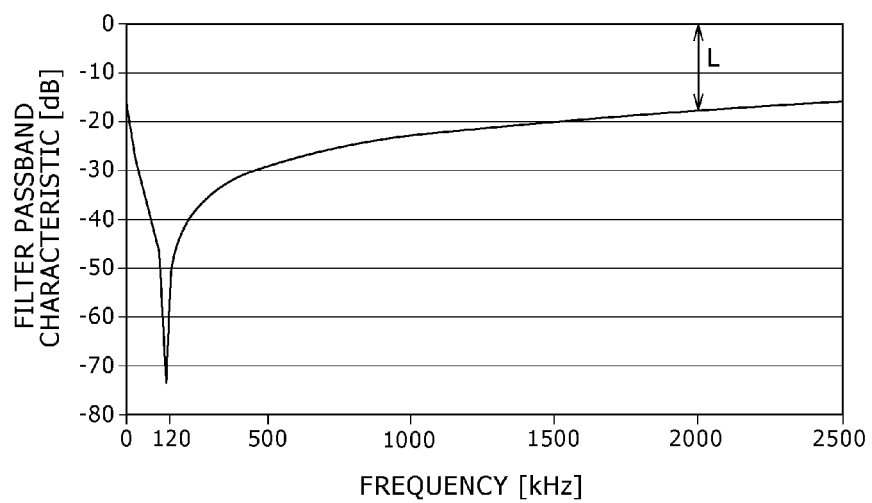
FIG. 5 is a graph showing an example of the relationship between the frequency and filter loss of the transmission carrier removing filter portion.

FIG. 5 shows an example of the relationship between the frequency and filter passband characteristic of the transmission carrier removing filter portion 33.

In the example of FIG. 5, loss is large near 120 kHz, which is the power transmission frequency. Therefore, it turns out that the Q-factor measurement signal source 31 can be prevented from being broken due to input of high power of the power transmission signal to the Q-factor measurement signal source 31.

On the other hand, near 2 MHz as the frequency for Q-factor measurement, the Q-factor measurement signal has smaller loss compared with 120 kHz as the power transmission frequency and thus passes. Therefore, it can be superimposed on the power transmission signal. Loss L of the Q-factor measurement signal near 2 MHz is about 18 dB. However, this level of loss causes no problem because about 50 mV is enough as the amplitude of the voltage input to the resonant circuit including the power receiving coil 21.

In this manner, the transmission carrier removing filter portion 33 of the detecting section 26 (FIG. 2) allows the passage of the Q-factor measurement signal generated by the Q-factor measurement signal source 31 and does not allow the passage of the power transmission signal in the direction from the resonant circuit side (including the resonant frequency adjuster 32) toward the Q-factor measurement signal source 31 and the Q-factor measuring circuit 34.

Figure 6:
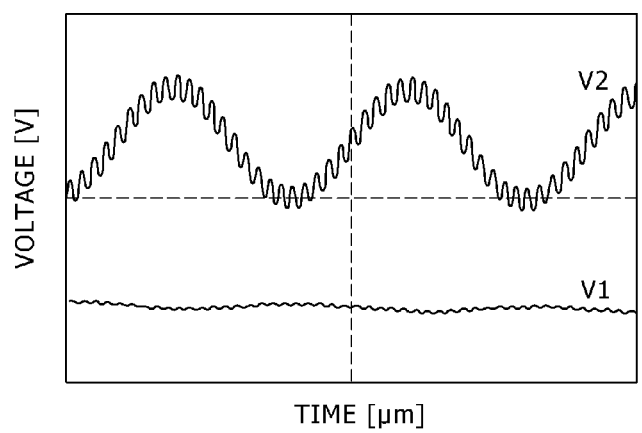
FIG. 6 is a graph showing a waveform example of a voltage V1 and a voltage V2 in FIG. 2.

FIG. 6 shows the state in which actually the power transmission signal of 120 kHz and the Q-factor measurement signal of 2 MHz are superimposed. FIG. 6 is a graph showing a waveform example of a voltage V1 and a voltage V2 in FIG. 2.

From FIG. 6, it turns out that the Q-factor measurement signal (voltage V2) of 2 MHz is amplified across the capacitor 23. When actually the signals are separated by frequency and the amplitude of the Q-factor measurement signal is seen, it can be confirmed that the voltage V2 (upper side in FIG. 6) on the posterior side of the capacitor 23 (on the side of the rectifier 24) is Q times the voltage V1 (lower side in FIG. 6) on the anterior side of the capacitor 23 (on the side of the power receiving coil 21).

FIGS. 7A and 7B are graphs showing a spectrum characteristic example of the respective voltages. FIG. 7A shows the spectrum characteristic of the voltage V1 and FIG. 7B shows the spectrum characteristic of the voltage V2.

As shown in FIGS. 7A and 7B, when the respective voltages are seen on the frequency axis, the Q-factor measurement signal of 2 MHz is amplified from 16 mV to 220 mV and is calculated as about 14 when being converted to the Q-factor. On the other hand, about the power receiving coil 21, the measurement result when the Q-factor in the Q-factor measurement state is seen by an LCR meter is shown in FIG. 8. In the example of FIG. 8, the Q-factor is 15 to 16 near 2 MHz. Thus, it can be confirmed that the Q-factor can be measured with high accuracy.

As described above, according to the first embodiment, the resonant frequency adjuster 32 of the detecting section 26 is provided and the configuration is so made that the resonant circuit resonates at a new frequency (second frequency) different from the resonant frequency (first frequency) of the resonant circuit composed of the power receiving coil 21 and the capacitors 22 and 23.

Furthermore, by the transmission carrier removing filter portion 33 of the detecting section 26, the Q-factor measurement signal having a frequency different from that of the power transmission signal is superimposed on the power transmission signal received via the power receiving coil 21 and the Q-factor is measured by using the AC signal obtained by removing the power transmission signal from the AC signal resulting from the combining of two signals.

Therefore, the power receiving device can perform the Q-factor measurement while receiving the power transmission signal from the power transmitting device. Because operation of stopping the power transmission is absent, the communication between the transmission and reception sides can be reduced and simplification of the control flow is expected.

Furthermore, a new coil and sensor do not need to be added.

In addition, it is possible to detect a metal foreign substance with high accuracy compared with the related-art method for foreign substance detection and so forth based on the DC-DC efficiency.

Moreover, because the control flow is simplified, the redundant time necessary for the control for the Q-factor measurement is reduced and the power transmission efficiency per unit time is enhanced. Or the operation of detecting a metal foreign substance can be carried out at a shorter interval, which leads to early detection of a metal foreign substance.

Furthermore, when the number of power receiving devices is two or more, power transmission to the power receiving devices other than the power receiving device in which Q-factor measurement is being performed does not need to be stopped. Therefore, power transmission, Q-factor measurement, and so forth can be performed in parallel in each of the plural power receiving devices.

(Other Configuration Examples of Resonant Circuit)

In the above-described first embodiment, the example is explained in which the capacitor 22 in parallel to the power receiving coil 21 and the capacitor 23 in series to the parallel connection of the power receiving coil 21 and the capacitor 22 are used for impedance matching of the power receiving coil 21 of the resonant circuit in the state in which the resonant frequency adjuster 32 is not connected thereto. However, another configuration can be employed as the resonant circuit.

Figure 9A:
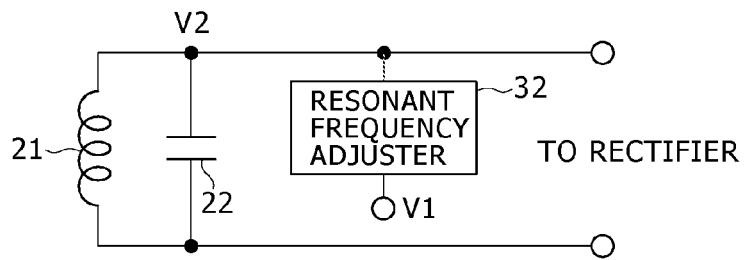
FIGS. 9A to 9C are circuit diagrams showing configuration examples of a resonant circuit.
Figure 9B:
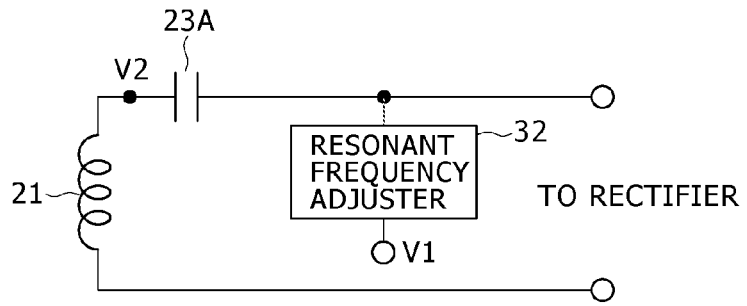
Figure 9C:
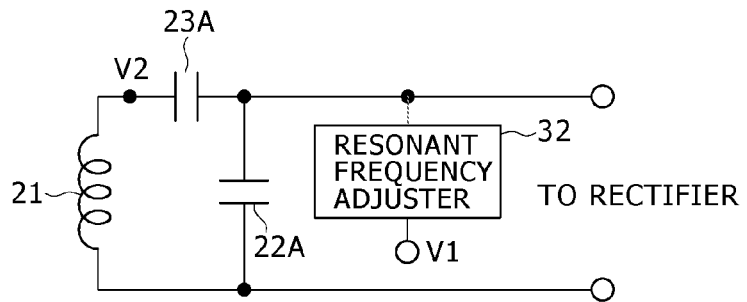

FIG. 9A to FIG. 9C are circuit diagrams showing other configuration examples of the resonant circuit.

FIG. 9A shows an example in which the resonant circuit in the state in which the resonant frequency adjuster 32 is not connected thereto is configured by using the capacitor 22 in parallel to the power receiving coil 21. The resonant frequency adjuster 32 is connected to the connecting point between the power receiving coil 21 and the capacitor 22 configuring this resonant circuit.

FIG. 9B shows an example in which the resonant circuit in the state in which the resonant frequency adjuster 32 is not connected thereto is configured by using a capacitor 23A in series to the power receiving coil 21. The resonant frequency adjuster 32 is connected to the rectifier side of the capacitor 23A configuring this resonant circuit.

FIG. 9C shows an example in which the resonant circuit in the state in which the resonant frequency adjuster 32 is not connected thereto is configured by using the power receiving coil 21, the capacitor 23A, and a capacitor 22A to form a closed circuit. The resonant frequency adjuster 32 is connected to the connecting middle point between the capacitor 23A and the capacitor 22A configuring this resonant circuit.

In all resonant circuits, the voltage V2 between both ends of the power receiving coil 21 and the voltage V1 from the power receiving coil 21 to the resonant frequency adjuster 32 are detected to measure the Q-factor.

These resonant circuits are one example and the configuration of the resonant circuit is not limited to these examples.

Modification Example of First Embodiment

As a modification example of the first embodiment, an example in which the connecting point of the resonant frequency adjuster 32 of the power receiving device is changed will be described.

Figure 10:
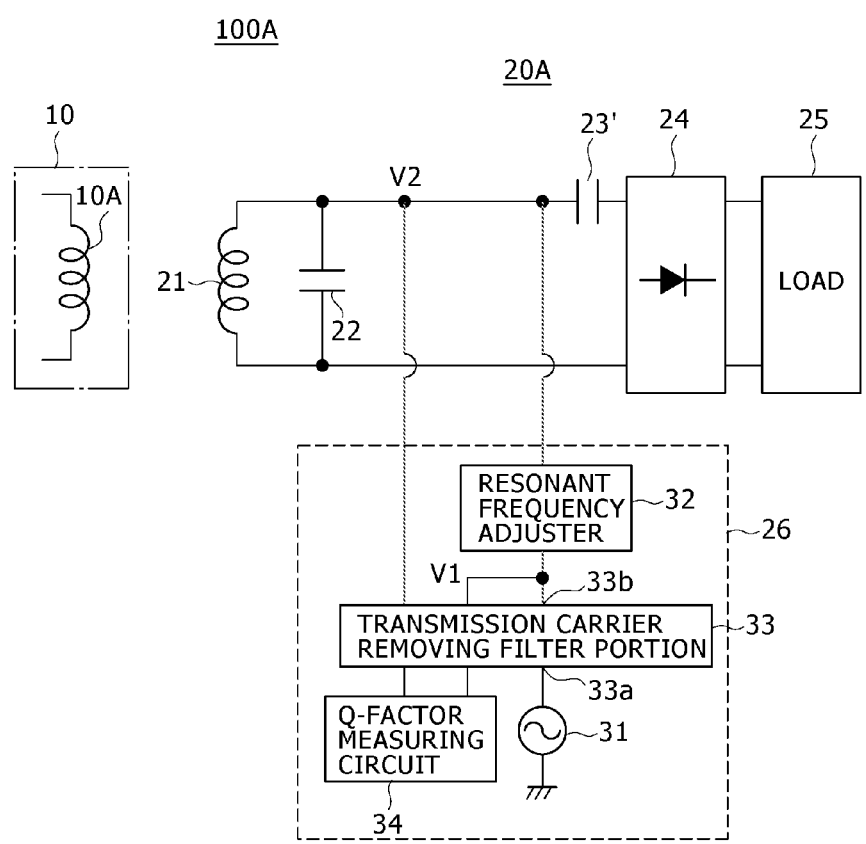
FIG. 10 is a schematic circuit diagram showing a configuration example of a power receiving device in a contactless power transmission system according to a modification example of the first embodiment of the present disclosure.

FIG. 10 is a schematic circuit diagram showing a configuration example of the power receiving device in the contactless power transmission system according to the modification example (hereinafter, referred to also as the "present example") of the first embodiment of the present disclosure. In the description of FIG. 10, explanation is omitted about the same configuration as that in FIG. 2.

A contactless power transmission system 100A shown in FIG. 10 includes the power transmitting device 10 (primary side) including at least the power transmitting coil 10A and a power receiving device 20A (secondary side). The power receiving device 20A is one example of the detecting device.

The power receiving device 20A of the present example is different from the power receiving device 20 of FIG. 2 in the connection between the resonant circuit and the resonant frequency adjuster 32.

In the power receiving device 20, the resonant frequency adjuster 32 is connected to the connecting middle point between the capacitor 23 and the rectifier 24. In the power receiving device 20A of the present example, the resonant frequency adjuster 32 is connected to the connecting middle point between the parallel connection of the coil 21 and the capacitor 22 and a capacitor 23'. The capacitor 23' is also connected to the rectifier 24. The capacitor 23' of the power receiving device 20A corresponds to the capacitor 23 of the power receiving device 20 and configures a resonant circuit.

The resonant frequency adjuster 32 of the power receiving device 20A is to measure the Q-factor in the resonant state and changes the resonant frequency of the resonant circuit of the power receiving device 20A similarly to the power receiving device 20.

Also in the power receiving device 20A configured in this manner, the voltage V1 and the voltage V2 of the Q-factor measurement signal can be measured and the Q-factor of the power receiving coil 21 can be measured similarly.

Compared with FIG. 2, in the configuration of FIG. 10, the resonant frequency of the Q-factor measurement signal can be set lower than the frequency of the power transmission signal even when the resonant frequency adjuster 32 is configured by only a capacitor. In this case, the Q-factor measurement can be performed with the Q-factor measurement signal having a frequency lower than that of the power transmission signal and the influence of that harmonic components and so forth of the power transmission signal look noise against the Q-factor measurement signal can be alleviated.

(Other Configuration Examples of Resonant Circuit)

In the above-described modification example of the first embodiment, the example is explained in which the capacitor 22 in parallel to the power receiving coil 21 and the capacitor 23' in series to the parallel connection of the power receiving coil 21 and the capacitor 22 are used for impedance matching of the power receiving coil 21 of the resonant circuit in the state in which the resonant frequency adjuster 32 is not connected thereto. However, another configuration can be employed as the resonant circuit.

Figure 11A:
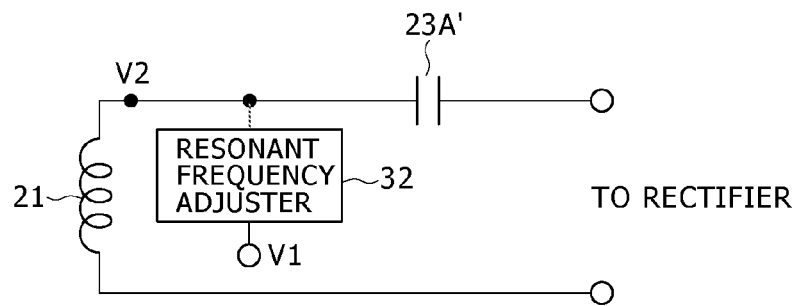
FIGS. 11A and 11B are circuit diagrams showing configuration examples of the resonant circuit.
Figure 11B:
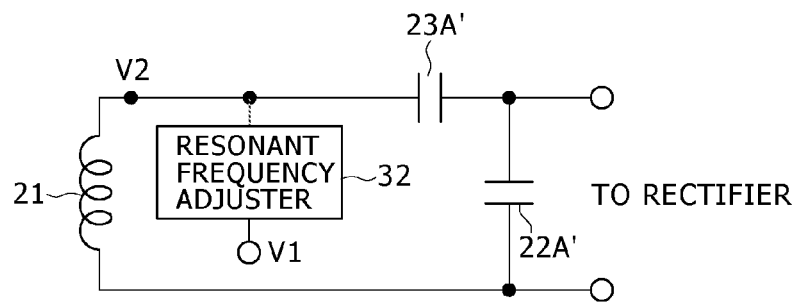

FIG. 11A and FIG. 11B are circuit diagrams showing other configuration examples of the resonant circuit.

FIG. 11A shows an example in which the resonant circuit in the state in which the resonant frequency adjuster 32 is not connected thereto is configured by using a capacitor 23A' in series to the power receiving coil 21. The resonant frequency adjuster 32 is connected to the connecting middle point between the power receiving coil 21 and the capacitor 23A' configuring this resonant circuit.

FIG. 11B shows an example in which the resonant circuit in the state in which the resonant frequency adjuster 32 is not connected thereto is configured by using the power receiving coil 21, the capacitor 23A', and a capacitor 22A' to form a closed circuit. The resonant frequency adjuster 32 is connected to the connecting middle point between the power receiving coil 21 and the capacitor 23A' configuring this resonant circuit.

In all resonant circuits, the voltage V2 between both ends of the power receiving coil 21 and the voltage V1 from the power receiving coil 21 to the resonant frequency adjuster 32 are detected to measure the Q-factor.

These resonant circuits are one example and the configuration of the resonant circuit is not limited to these examples.

3. Second Embodiment

To accurately measure the Q-factor of the resonant circuit, the impedance of the rectifier side from the viewpoint of the resonant circuit should be high. For this purpose, the rectifier may be separated to be set to the open state as one example.

So, in a second embodiment, an example will be explained in which a separator to separate the load is provided for the power receiving device 20 (see FIG. 2) according to the first embodiment so that the detecting section may be separated from the load in Q-factor measurement.

Power cannot be received when the rectifier is separated. However, even in this case, there is an advantage that the system does not need to go through a complicated control flow of stopping power transmission of the primary side. The power supply to the Q-factor measuring circuit in this case is driven by using the load 25 (battery etc.) possessed on the secondary side or a charge stored in the capacitor.

[Configuration Example of Power Receiving Device]

Figure 12:
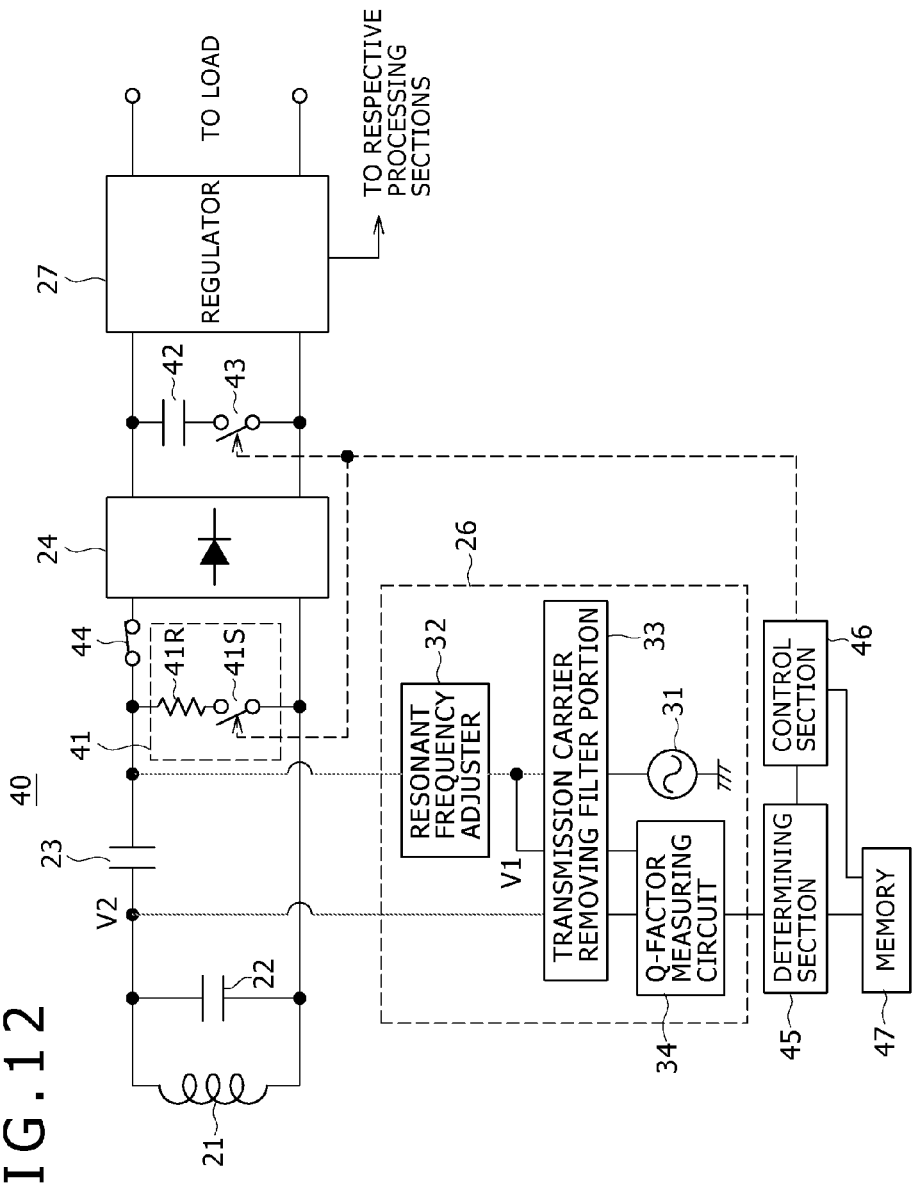
FIG. 12 is a circuit diagram showing a configuration example of a power receiving device according to a second embodiment of the present disclosure.

FIG. 12 is a circuit diagram showing a configuration example of a power receiving device according to the second embodiment of the present disclosure. In the following, the differences between a power receiving device 40 shown in FIG. 12 and the power receiving device 20 according to the first embodiment will be mainly explained and explanation of the other part will be omitted.

The power receiving device 40 according to the present embodiment is different from the power receiving device 20 of FIG. 2 mainly in that a communication section 41 for transmitting data to the external, a capacitor 42 for the charge, and a separator 44 are provided.

The communication section 41 is formed of a series circuit of a resistive element 41R and a switch part 41S and is connected in parallel between the resonant circuit and the rectifier 24. Specifically, one terminal of the series circuit of the resistive element 41R and the switch part 41S is connected to the capacitor 23 and the other terminal is connected to the power receiving coil 21 and the capacitor 22.

When data transmission is performed from the power receiving device 20 to the power transmitting device 10, it can be performed by using e.g. a load modulation system. Specifically, the value of the load resistive component in parallel to the power receiving coil 21 is changed through switching of opening/closing of the switch part 41S by a control section 46 in association with a transmission data string (baseband signal). Thereby, the AC signal output by the power transmitting device 10 is subjected to amplitude modulation and the transmission data string from the power receiving device 20 is observed on the side of the power transmitting device 10.

Although the example in which communication is performed by utilizing a load modulation system is explained in this example, another short-distance wireless communication system such as Bluetooth (registered trademark) or ZigBee (registered trademark) may be utilized.

On the subsequent stage side of the rectifier 24, the capacitor 42 and a switch part 43 are connected in series. One terminal of this capacitor 42 is connected to one output terminal of the rectifier 24 and one terminal of the switch part 43 is connected to the other output terminal of the rectifier 24. Furthermore, one and the other output terminals of the rectifier 24 are connected to one and the other input terminals of a regulator 27. One and the other output terminals of the regulator 27 are connected to a load.

The regulator 27 carries out control so that the output voltage and current may be always kept constant. As one example, it supplies a constant voltage signal (power supply) to the power feed target (load) and the respective blocks typified by the detecting section 26. A regulator different from the regulator 27 may be provided to separate the constant voltage signal supplied to the power feed target from that supplied to the respective blocks.

The separator 44 is provided between the communication section 41 and the rectifier 24 as one example. Under control by the control section 46, it is turned on in power feed to supply power to the load whereas it is turned off in Q-factor measurement to separate the load. The position at which the separator 44 is disposed is not limited thereto. For example, the following positions will be available: inside of the rectifier 24, position between the rectifier 24 and the capacitor 42 for the charge, and position anterior or posterior to the regulator 27.

As one example, a switching element such as a transistor or a MOSFET can be applied to the switch parts 41S and 43 and the separator 44.

A determining section 45 is connected to the Q-factor measuring circuit 34 of the detecting section 26 and compares the Q-factor input from the Q-factor measuring circuit 34 with a reference value stored in a non-volatile memory 47. Then, the determining section 45 determines whether or not a metal foreign substance exists near the power receiving coil 21 based on the result of the comparison and outputs the determination result to the control section 46.

The control section 46 is one example of the control section. It controls the communication section 41 according to need and transmits the determination result of the metal foreign substance from the power receiving coil 21 to the power transmitting device 10. Moreover, the control section 46 switches On/Off of the switch part 43 and carries out control to charge the capacitor 42 for the charge with a DC signal supplied from the rectifier 24. An arithmetic processing device such as a micro-processing unit (MPU) can be applied to the control section 46.

The processing of the determining section 45 and the control section 46 may be handled by one MPU. Alternatively, a configuration may be employed in which the processing of the determining section 45, the control section 46, and the Q-factor measuring circuit 34 or the processing of the determining section 45, the control section 46, the Q-factor measuring circuit 34, and the transmission carrier removing filter portion 33 is handled by an analog-digital converter and an MPU.

The memory 47 stores the reference values of the secondary-side Q-factor on a frequency-by-frequency basis, measured in advance in the state in which no object exists near the power receiving coil 21 or no object is put on the power receiving coil 21. Furthermore, the memory 47 may store an ID number (identification information) allocated to each power receiving device, an ID number acquired from the power transmitting device, and so forth.

In the power receiving device 40 shown in FIG. 12, the connection form shown in FIG. 2 is employed as the connection form between the resonant circuit and the resonant frequency adjuster 32. However, it is obvious that the connection form shown in FIG. 10 may be employed. Furthermore, the resonant circuit of the power receiving device 40 can employ various configurations of the resonant circuit like those shown in FIGS. 9A to 9C and FIGS. 11A and 11B.

Operation Example of Power Receiving Device

First Example

Figure 13:
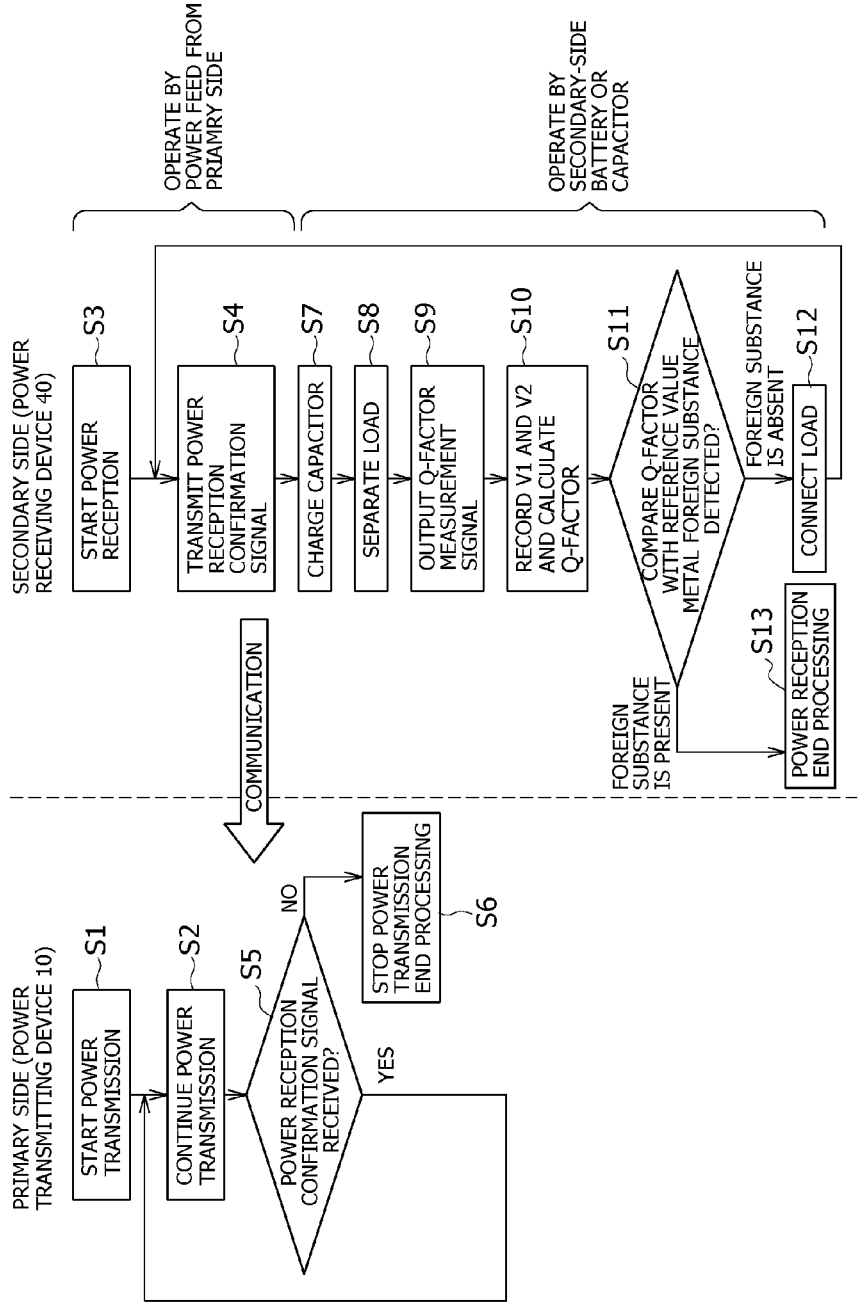
FIG. 13 is a flowchart showing an operation example in Q-factor measurement of a contactless power transmission system according to the second embodiment.

An operation example of the power receiving device 40 will be described. FIG. 13 is a flowchart showing an operation example (first example) in Q-factor measurement of the contactless power transmission system including the power transmitting device 10 (FIG. 2) and the power receiving device 40.

First, the power transmitting device 10 (primary side) starts power transmission (step S1) and continues the power transmission until an order of power transmission stop or the like is issued (step S2).

On the other hand, the power receiving device 40 (secondary side) receives the power transmission signal output from the power transmitting device 10 and starts power reception (step S3). Thereupon, the control section 46 controls the communication section 41 to transmit a power reception confirmation signal to the power transmitting device 10 (step S4). The power reception confirmation signal is output to the power transmitting device by the power receiving device that is currently receiving power and includes information indicating that its output source is currently receiving power. In the processing of these steps S3 and S4, the power receiving device 40 operates by using the power of the power transmission signal received from the primary side.

The power transmitting device 10 determines whether or not the power reception confirmation signal is received from the power receiving device 40 (step S5). If the power reception confirmation signal is not received, the power transmitting device 10 stops the power transmission and executes end processing (step S6). If the power reception confirmation signal is received, the power transmitting device 10 moves to the processing of the step S2 to continue the power transmission.

After transmitting the power reception confirmation signal, the control section 46 of the power receiving device 40 turns on the switch part 43 to obtain from the power transmission signal the power consumed in the detecting section 26 and so forth at least in Q-factor measurement and charge the capacitor 42 for the charge with the obtained power (step S7). After charging the capacitor 42 with the power necessary for Q-factor measurement, the control section 46 turns off the separator 44 to separate the load (step S8).

The respective portions in the detecting section 26 perform Q-factor measurement after the load is separated from the detecting section 26. First, the Q-factor measurement signal source 31 generates the Q-factor measurement signal having a frequency different from that of the power transmission signal received by the power receiving coil 21 (step S9).

The Q-factor measurement signal generated by the Q-factor measurement signal source 31 passes through the transmission carrier removing filter portion 33 to be superimposed on the power transmission signal. Then, the power transmission signal is removed by the transmission carrier removing filter portion 33 from the AC signal resulting from the combining of the power transmission signal and the Q-factor measurement signal, and this AC signal from which the power transmission signal is removed, i.e. the Q-factor measurement signal (voltages V1 and V2), is input to the Q-factor measuring circuit 34.

The Q-factor measuring circuit 34 detects, from the input Q-factor measurement signal, the voltage V1 between the resonant frequency adjuster 32 and the transmission carrier removing filter portion 33 and the voltage V2 on the anterior side of the capacitor 23. Then, the Q-factor measuring circuit 34 records the voltages V1 and V2 in e.g. the memory 47 and calculates the Q-factor (step S10).

The determining section 45 compares the Q-factor calculated by the Q-factor measuring circuit 34 with the reference value retained in the memory 47 and determines whether or not a metal foreign substance exists near the power receiving coil 21 (step S11).

If the determining section 45 determines that a metal foreign substance is absent, the control section 46 turns on the separator 44 to connect the resonant circuit and the detecting section 26 to the load (step S12) and moves to the processing of transmitting the power reception confirmation signal in the step S4.

If it is determined that a metal foreign substance is present, the control section 46 executes power reception end processing (step S13).

In the processing of these steps S7 to S13, the power receiving device 40 operates by utilizing the power stored in the secondary-side battery or the capacitor. In this example, the power receiving device 40 utilizes the power stored in the capacitor 42.

As just described, the configuration is so made that the separator 44 is turned on in power feed to supply power to the load whereas the separator 44 is turned off in Q-factor measurement to separate the load. Therefore, the accurate Q-factor measurement can be performed without suffering from the influence of the load side in the Q-factor measurement.

Second Example

Figure 14:
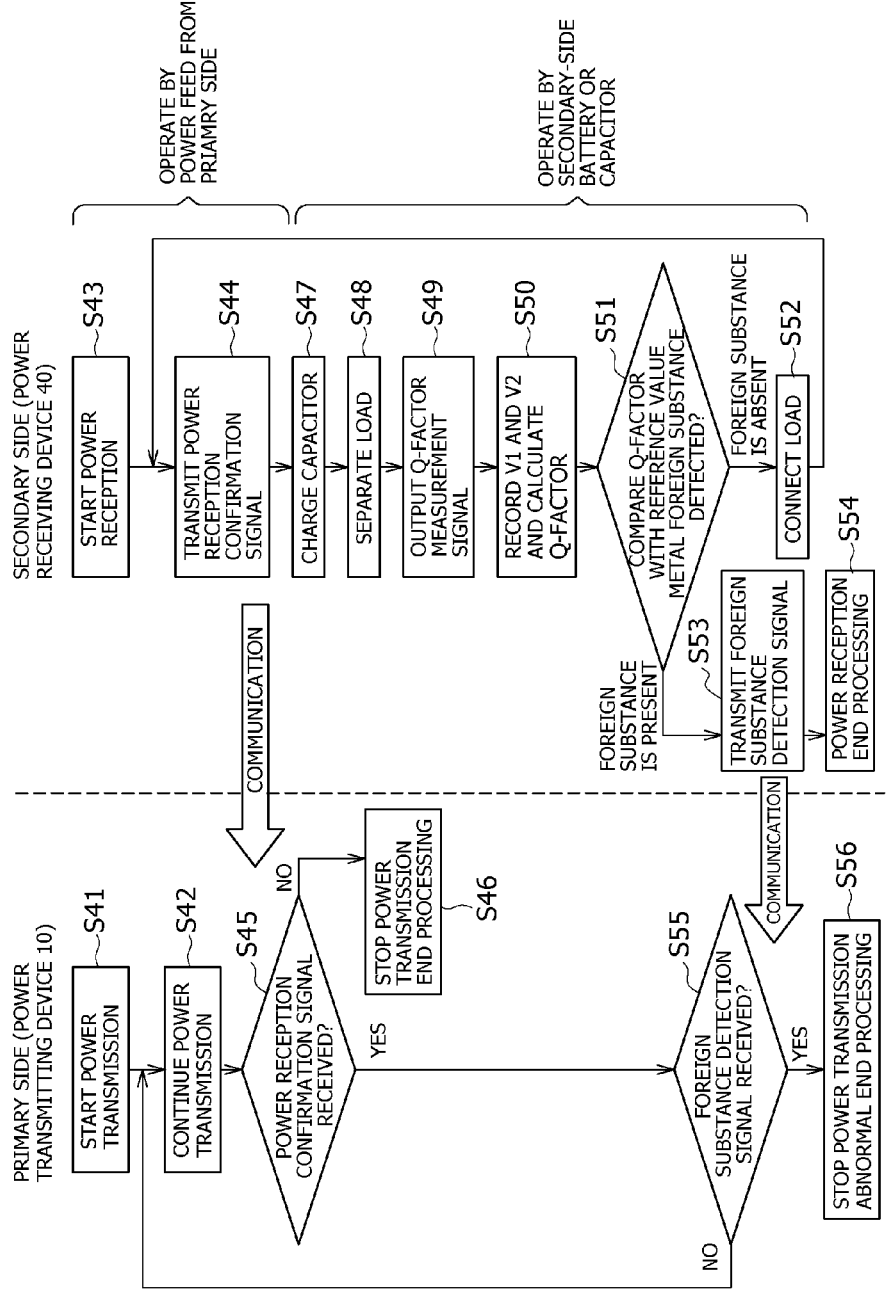
FIG. 14 is a flowchart showing an operation example (Q-factor measurement result is transmitted) in Q-factor measurement of the contactless power transmission system according to the second embodiment.

FIG. 14 is a flowchart showing an operation example (second example) in Q-factor measurement of the contactless power transmission system including the power transmitting device 10 (FIG. 2) and the power receiving device 40. The second example is different from the first example in that the determination result of the metal foreign substance is transmitted from the power receiving device 40 to the power transmitting device 10.

Processing of steps S41 to S52 in FIG. 14 is the same as the processing of the steps S1 to S12 in FIG. 13 and therefore description thereof is omitted.

If it is determined in determination processing of the step S51 that a metal foreign substance is present, the control section 46 controls the communication section 41 to transmit a foreign substance detection signal to the power transmitting device 10 (step S53). Then, after transmitting the foreign substance detection signal to the power transmitting device 10, the control section 46 executes power reception end processing (step S54).

The power transmitting device 10 determines whether or not the foreign substance detection signal is received from the power receiving device 40 (step S55). If the foreign substance detection signal is not received, the power transmitting device 10 moves to the processing of the step S42 to continue the power transmission. If the foreign substance detection signal is received, the power transmitting device 10 stops the power transmission and executes abnormal end processing (step S56).

In this manner, when determining that a metal foreign substance is present, the power receiving device 40 transmits the foreign substance detection signal to the power transmitting device 10. Thereby, even when the power reception confirmation signal is not transmitted from the power receiving device 40, the power transmitting device 10 can understand the reason for this. For example, when getting to know the existence of a metal foreign substance between the power transmitting device 10 and the power receiving device 40, the power transmitting device 10 can take a proper countermeasure against heat generation of the metal foreign substance, such as stopping the power transmission or making abnormal end.

4. Third Embodiment

Configuration Example of Power Receiving Device

For example, when a filter section is disposed anterior to (on the resonant circuit side of) the rectifier 24 in FIG. 2, Q-factor measurement can be performed without stopping power reception although there is a possibility of increase in loss of the power transmission signal.

So, in a third embodiment, an example will be explained in which a measurement signal removing filter section 56 is provided anterior to (on the resonant circuit side of) the rectifier 24 of the power receiving device 20 (see FIG. 2) according to the first embodiment. This configuration allows the impedance of the rectifier side to appear high for the Q-factor measurement signal.

Figure 15:
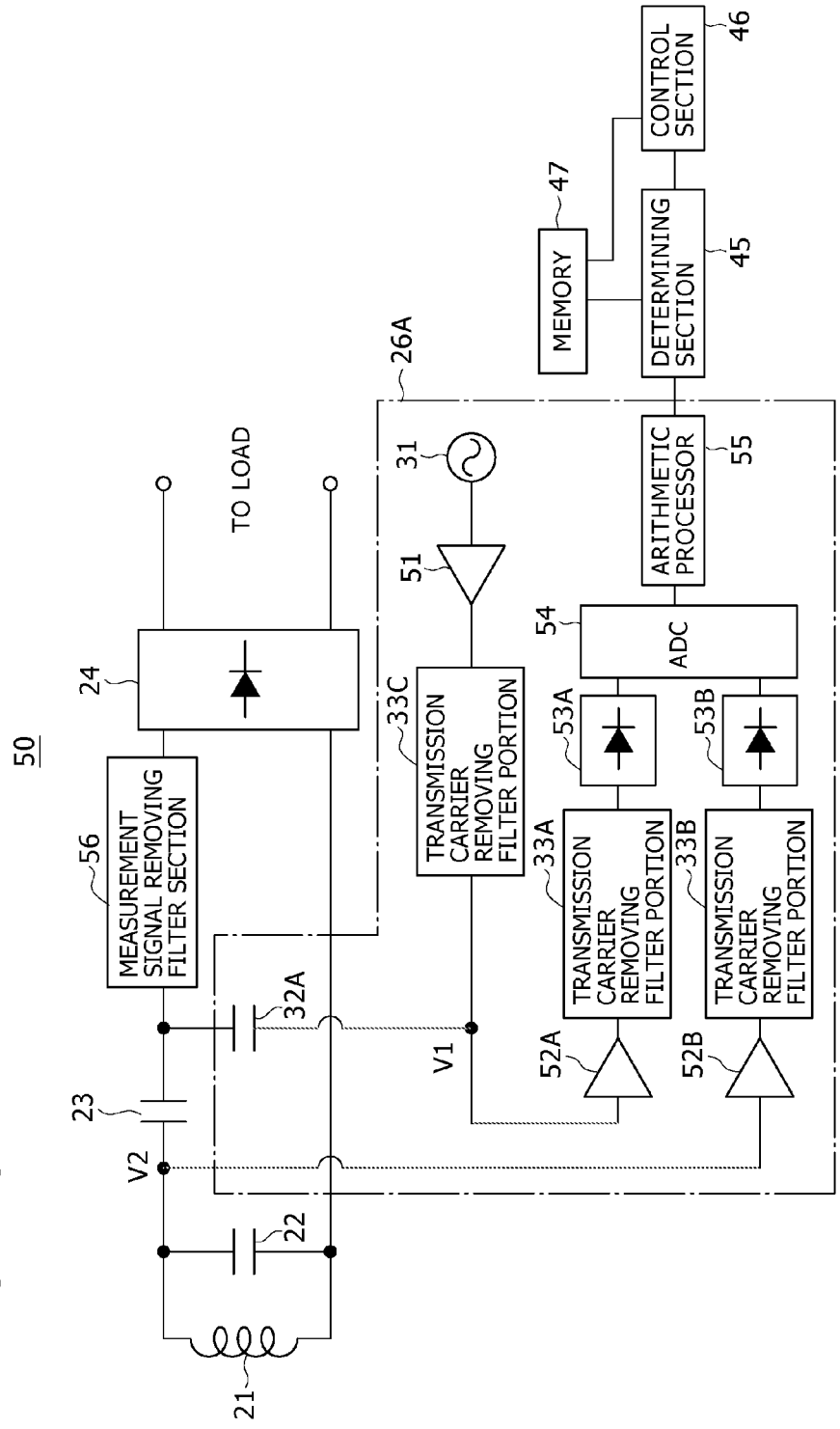
FIG. 15 is a circuit diagram showing a configuration example of a power receiving device according to a third embodiment of the present disclosure.

FIG. 15 is a circuit diagram showing a configuration example of a power receiving device according to the third embodiment of the present disclosure.

In a power receiving device 50, the measurement signal removing filter section 56 is provided between the capacitor 23 and the rectifier 24. In contrast to the transmission carrier removing filter portion 33, the measurement signal removing filter section 56 allows the passage of the power transmission signal with the first frequency received by the power receiving coil 21 and blocks the Q-factor measurement signal with the second frequency generated by the Q-factor measurement signal source 31.

In the example of FIG. 15, as one example, a detecting section 26A includes amplifiers 52A and 52B, transmission carrier removing filter portions 33A and 33B at the subsequent stage thereof, rectifiers 53A and 53B, an analog-digital converter (hereinafter, referred to as the "ADC") 54, an arithmetic processor 55, and a capacitor 32A. Furthermore, the detecting section 26A includes the Q-factor measurement signal source 31, an amplifier 51, and a transmission carrier removing filter portion 33C. The transmission carrier removing filter portions 33A to 33C correspond to the transmission carrier removing filter portion 33.

In addition, the power receiving device 50 includes the determining section 45 connected to the arithmetic processor 55 of the detecting section 26A, the control section 46 connected to this determining section 45, and the memory 47 connected to the determining section 45 and the control section 46.

The capacitor 32A is one example of the resonant frequency adjuster 32 (see FIG. 2). One terminal thereof is connected to the connecting middle point between the capacitor 23 and the measurement signal removing filter section 56. The other terminal of the capacitor 32A is connected to the transmission carrier removing filter portion 33C.

The input terminal of the amplifier 52A is connected to the other terminal of the capacitor 32A for resonant frequency adjustment. The input terminal of the amplifier 52B is connected to the connecting middle point between the capacitor 22 and the capacitor 23.

The output terminal of the amplifier 52A is connected to the transmission carrier removing filter portion 33A and the output terminal of the amplifier 52B is connected to the transmission carrier removing filter portion 33B. The transmission carrier removing filter portions 33A and 33B remove the power transmission signal from the AC signal resulting from combining of the input power transmission signal and Q-factor measurement signal. Then, the transmission carrier removing filter portion 33A inputs the AC signal (corresponding to the voltage V1) resulting from the removal of the power transmission signal to the rectifier 53A. Furthermore, the transmission carrier removing filter portion 33B inputs the AC signal (corresponding to the voltage V2) resulting from the removal of the power transmission signal to the rectifier 53B.

The rectifier 53A detects (rectifies) the input AC signal and inputs the detected signal to the ADC 54 and the rectifier 53B detects (rectifies) the input AC signal and inputs the detected signal to the ADC 54.

The ADC 54 converts the analog detected signals input from the rectifiers 53A and 53B to digital signals and outputs the respective signals to the arithmetic processor 55.

As one example of the Q-factor measuring circuit 34 in FIG. 2, the arithmetic processor 55 calculates the ratio between the voltage V1 and the voltage V2, i.e. the Q-factor, from the detected signals input from the ADC 54 and outputs this Q-factor to the determining section 45. For example, an arithmetic processing device such as a micro-processing unit (MPU) can be applied to the arithmetic processor 55.

Then, the determining section 45 compares the Q-factor calculated by the arithmetic processor 55 with the reference value retained in the memory 47 and determines whether or not a metal foreign substance is present. The determining section 45 outputs the determination result to the control section 46.

Although the communication section 41 like that in the power receiving device 40 of FIG. 12 is not shown in the power receiving device 50 shown in FIG. 15, the power receiving device 50 also includes the communication section 41.

Figure 16:
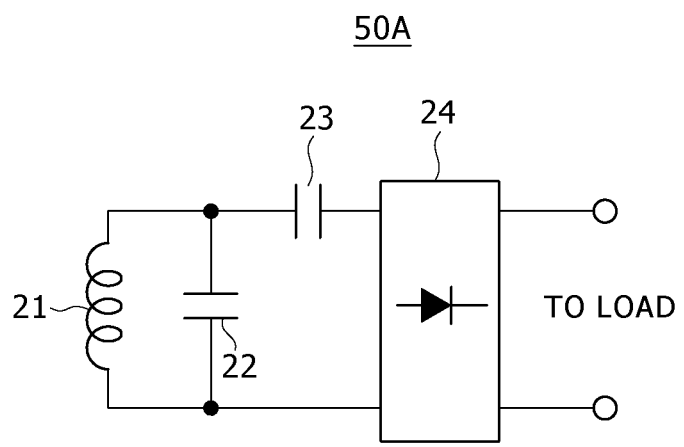
FIG. 16 is an equivalent circuit diagram for the power transmission frequency of the power receiving device of FIG. 15.
Figure 17:
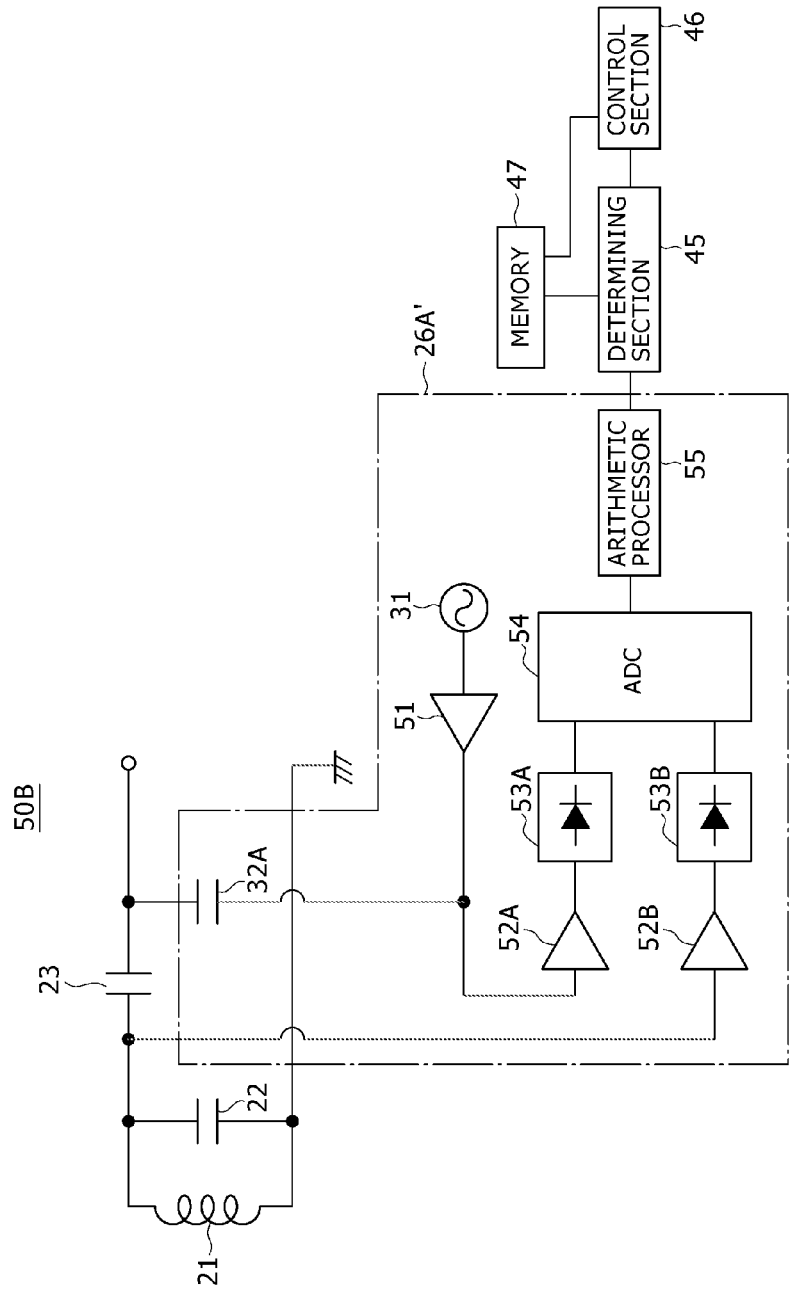
FIG. 17 is an equivalent circuit diagram for the Q-factor measurement frequency of the power receiving device of FIG. 15.

In the configuration shown in FIG. 15, by providing the transmission carrier removing filter portions 33A to 33C and the measurement signal removing filter section 56, an equivalent circuit 50A shown in FIG. 16 is realized for the power transmission frequency and an equivalent circuit 50B shown in FIG. 17 is realized for the Q-factor measurement frequency.

Specifically, for the power transmission frequency, a circuit equivalent to the state in which the detecting section 26A does not exist is obtained as shown in FIG. 16. For the Q-factor measurement frequency, as shown in FIG. 17, a circuit equivalent to the state in which the configuration of the detecting section 26A changes as if it becomes the configuration of a detecting section 26A' and the load subsequent to the rectifier 24 is not connected is obtained.

In the power receiving device 50 shown in FIG. 15, the connection form shown in FIG. 2 is employed as the connection form between the resonant circuit and the resonant frequency adjuster 32. However, it is obvious that the connection form shown in FIG. 10 may be employed. Furthermore, the resonant circuit of the power receiving device 50 can employ various configurations of the resonant circuit like those shown in FIGS. 9A to 9C and FIGS. 11A and 11B.

Operation Example of Power Receiving Device

First Example

Figure 18:
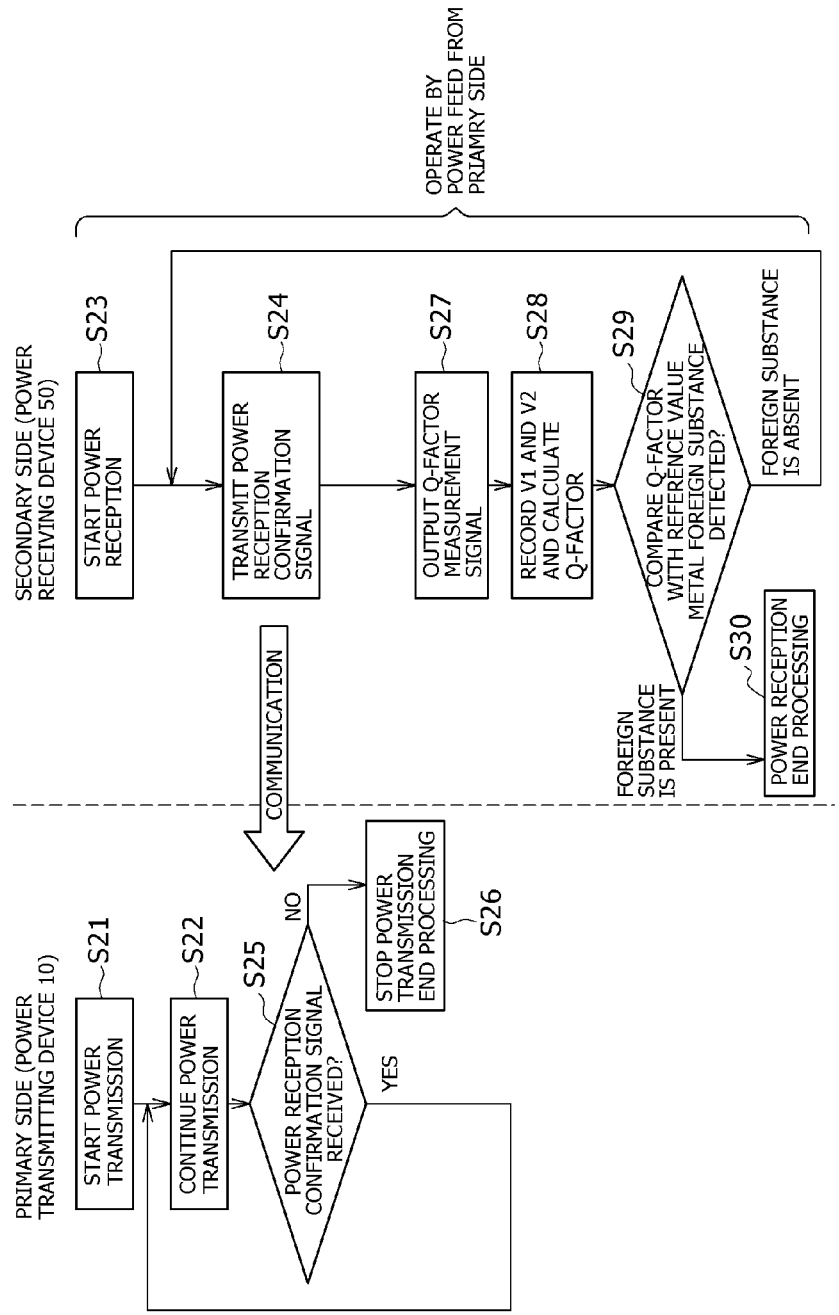
FIG. 18 is a flowchart showing an operation example in Q-factor measurement of a contactless power transmission system according to the third embodiment.

An operation example of the power receiving device 50 will be described. FIG. 18 is a flowchart showing an operation example (first example) in Q-factor measurement of a contactless power transmission system including the power transmitting device 10 (FIG. 2) and the power receiving device 50. In this example, the processing of capacitor charge and load separation is unnecessary compared with the flowchart of FIG. 13.

Processing from steps S21 to S26, in which first the power transmitting device 10 (primary side) starts power transmission and then the power receiving device 50 starts power reception and transmits the power reception confirmation signal to the power transmitting device 10 and thereafter the power transmitting device 10 reacts depending on whether or not this power reception confirmation signal is received, is the same as the processing from the steps S1 to S6 in FIG. 13 and therefore description thereof is omitted.

After the end of the processing of the step S24, the respective sections in the detecting section 26A perform Q-factor measurement. First, the Q-factor measurement signal source 31 generates the Q-factor measurement signal having a frequency different from that of the power transmission signal received by the power receiving coil 21 (step S27).

The Q-factor measurement signal generated by the Q-factor measurement signal source 31 passes through the transmission carrier removing filter portion 33C to be superimposed on the power transmission signal. Then, the power transmission signal is removed by the transmission carrier removing filter portions 33A and 33B from the AC signal obtained by the combining of the power transmission signal and the Q-factor measurement signal. This AC signal from which the power transmission signal is removed, i.e. the Q-factor measurement signal (voltages V1 and V2), is input to the rectifiers 53A and 53B to be supplied to the arithmetic processor 55 finally.

The arithmetic processor 55 detects, from the input Q-factor measurement signal, the voltage V1 applied to the whole of the power receiving coil 21 and the capacitors 23 and 32A and the voltage V2 on the anterior side of the capacitor 23. Then, the arithmetic processor 55 records the voltages V1 and V2 in e.g. the memory 47 and calculates the Q-factor (step S28).

The determining section 45 compares the Q-factor calculated by the arithmetic processor 55 with the reference value retained in the memory 47 and determines whether or not a metal foreign substance exists near the power receiving coil 21 (step S29).

If the determining section 45 determines that a metal foreign substance is absent, the control section 46 moves to the processing of transmitting the power reception confirmation signal in the step S24.

If it is determined that a metal foreign substance is present, the control section 46 executes power reception end processing (step S30).

In this manner, without separating the load by the separator, accurate Q-factor measurement can be performed by the transmission carrier removing filter portion and the measurement signal removing filter section.

Furthermore, because the load separation is not performed, the power transmission signal of the primary side can be utilized as the power supply of the power receiving device 50. Therefore, the power receiving device 50 can carry out the series of operation by using the power of the power transmission signal received from the primary side without using a battery or a capacitor.

Second Example

Figure 19:
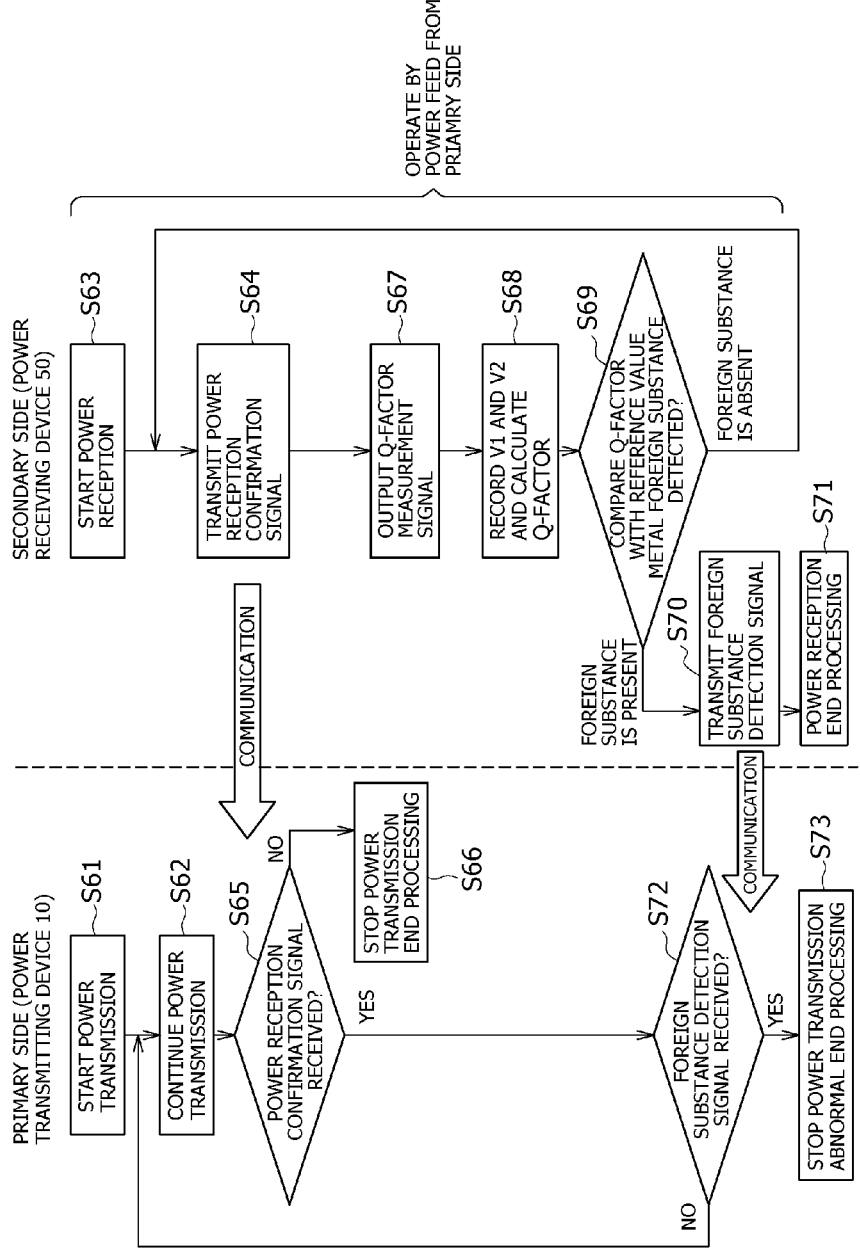
FIG. 19 is a flowchart showing an operation example (Q-factor measurement result is transmitted) in Q-factor measurement of the contactless power transmission system according to the third embodiment.

FIG. 19 is a flowchart showing an operation example (second example) in Q-factor measurement of the contactless power transmission system including the power transmitting device 10 (FIG. 2) and the power receiving device 50. The second example is different from the first example in that the determination result of the metal foreign substance is transmitted from the power receiving device 50 to the power transmitting device 10.

Processing of steps S61 to S69 in FIG. 19 is the same as the processing of the steps S21 to S29 in FIG. 18 and therefore description thereof is omitted.

If it is determined in determination processing of the step S69 that a metal foreign substance is present, the control section 46 controls the communication section 41 to transmit the foreign substance detection signal to the power transmitting device 10 (step S70). Then, after transmitting the foreign substance detection signal to the power transmitting device 10, the control section 46 executes power reception end processing (step S71).

The power transmitting device 10 determines whether or not the foreign substance detection signal is received from the power receiving device 50 (step S72). If the foreign substance detection signal is not received, the power transmitting device 10 moves to the processing of the step S62 to continue the power transmission. If the foreign substance detection signal is received, the power transmitting device 10 stops the power transmission and executes abnormal end processing (step S73).

In this manner, when determining that a metal foreign substance is present, the power receiving device 50 transmits the foreign substance detection signal to the power transmitting device 10. Thereby, even when the power reception confirmation signal is not transmitted from the power receiving device 50, the power transmitting device 10 can understand the reason for this. For example, when getting to know the existence of a metal foreign substance between the power transmitting device 10 and the power receiving device 50, the power transmitting device 10 can take a proper countermeasure against heat generation of the metal foreign substance, such as stopping the power transmission or making abnormal end.

5. Others

In the above-described first to third embodiment examples, the detecting sections 26 and 26A of the power receiving devices 20, 20A, 40, and 50 obtain the Q-factor from the voltage V1 between both ends of the coil of the resonant circuit and the resonant frequency adjuster 32 (capacitor, as one example) and the voltage V2 between both ends of the power receiving coil 21. However, the Q-factor may be obtained by a half width method.

Figure 20:
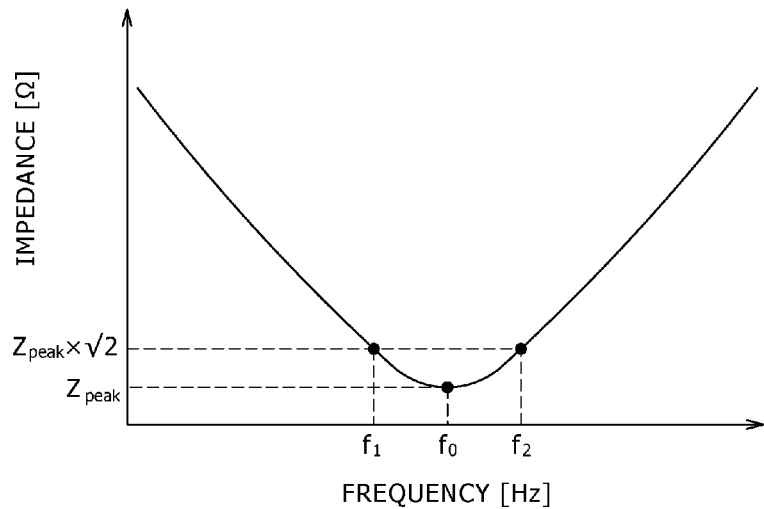
FIG. 20 is a graph showing a frequency characteristic example of the impedance in a series resonant circuit.

In the half width method, when a series resonant circuit is configured, the Q-factor is obtained by the following expression (2) based on the band (frequency f1 to f2) corresponding to the impedance that is $\sqrt{2}$ times the absolute value of the impedance (Zpeak) at a resonant frequency f0 as shown in a graph of FIG. 20.

$$Q = \frac{f_0}{f_2 - f_1} \quad (2)$$

Figure 21:
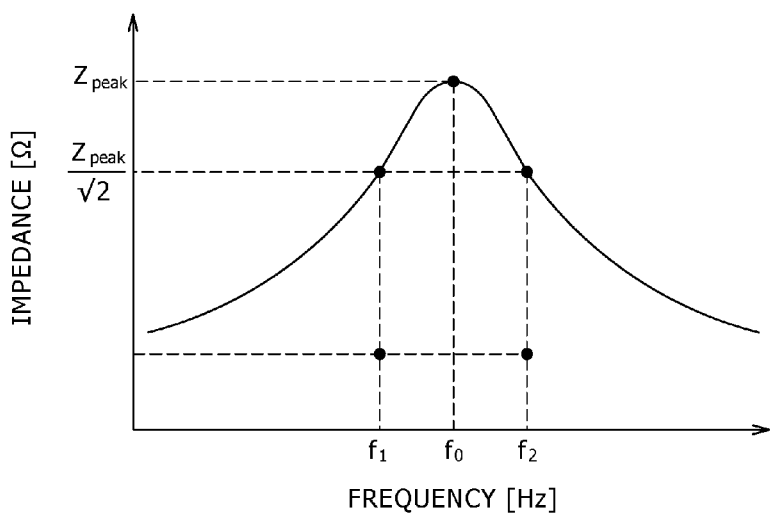
FIG. 21 is a graph showing a frequency characteristic example of the impedance in a parallel resonant circuit.

When a parallel resonant circuit is configured, the Q-factor is obtained by expression (2) based on the band (frequency f1 to f2) corresponding to the impedance that is $1/\sqrt{2}$ times the absolute value of the impedance (Zpeak) at the resonant frequency f0 as shown in a graph of FIG. 21.

In the above-described embodiment examples, Q-factor measurement and processing of detecting a metal foreign substance are executed in the power receiving device. However, the configuration is not limited to these examples. It is also possible to employ the following configuration. Specifically, information on the voltages V1 and V2 measured in the power receiving devices 20, 20A, 40, and 50, the frequency of the Q-factor measurement signal at the time of measurement, and the Q-factor reference value at this frequency are transmitted to the power transmitting device 10. Then, calculation of the secondary-side Q-factor and determination as to whether or not a metal foreign substance is present are performed in e.g. the determining section 45 of the power transmitting device 10. In this case, the processing burden of the power receiving device is reduced.

In the above-described embodiment examples, the explanation is made based on the assumption that the contactless power transmission system of the magnetic resonance system is configured. However, as already described, embodiments of the present disclosure are not limited to the magnetic resonance system and can be applied also to the electromagnetic induction system, in which the coupling coefficient k is set high and the Q-factor is set low.

In the above-described embodiment examples, the power transmitting device 10 is explained as the configuration having only the power transmission function and the power receiving devices 20, 20A, 40, and 50 are explained as the configuration having only the power reception function. However, the configuration is not limited thereto. For example, the power transmitting device 10 may have the power reception function and be capable of receiving power from the external via the power transmitting coil 10A. Conversely, the power receiving device 20 may have the power transmission function and be capable of transmitting power to the external via the power receiving coil 21.

In the above-described embodiment examples, the Q-factor at the resonant frequency is measured. However, the frequency at which the Q-factor is measured does not necessarily need to correspond with the resonant frequency. Even when the Q-factor is measured by using a frequency shifted from the resonant frequency within the allowable range, it is possible to enhance the accuracy of detection of the metal foreign substance existing between the power transmission side and the power reception side by utilizing the technique of the embodiments of the present disclosure.

Due to the approach of a conductor such as a metal to the power transmitting coil or the power receiving coil, not only the Q-factor but also the L value changes, so that the resonant frequency is shifted. The state of electromagnetic coupling may be detected by using both the amount of shift of the resonant frequency due to the change in the L value and the Q-factor in combination.

When a metal foreign substance is sandwiched between the power transmitting coil and the power receiving coil, the value of the coupling coefficient k also changes. The changes in both the value of the coupling coefficient k and the Q-factor may be used in combination for detection of the state of electromagnetic coupling.

In the above-described embodiment examples, examples of a coil having no core are explained as the power transmitting coil and the power receiving coil. However, a coil having such a structure as to be wound around a core having a magnetic body may be employed.

In the embodiment examples of the present disclosure, the portable apparatus of the secondary side can be applied to various pieces of apparatus requiring power, such as cellular phone, portable music player, and digital still camera.

The present disclosure can take also the following configurations.

(1)

A detecting device including:

a coil configured to be electromagnetically coupled to an external;

a resonant circuit configured to include at least the coil; and a detecting section configured to superimpose a measurement signal for measuring a Q-factor of the resonant circuit on a power transmission signal transmitted to the coil in a contactless manner and remove the power transmission signal from an alternating-current signal obtained by superimposing the measurement signal on the power transmission signal, the detecting section measuring the Q-factor by using the alternating-current signal from which the power transmission signal is removed.

(2)

The detecting device according to the above-described (1), wherein the power transmission signal is an alternating-current signal with a first frequency and the measurement signal is an alternating-current signal with a second frequency different from the first frequency.

(3)

The detecting device according to the above-described (1) or (2), wherein the detecting section includes a resonant frequency adjuster that is connected to the resonant circuit and is to change resonant frequency of the resonant circuit from the first frequency to the second frequency, a first frequency remover that does not allow passage of the alternating-current signal with the first frequency and allows passage of at least the alternating-current signal with the second frequency, and a Q-factor measuring section that calculates the Q-factor by using the alternating-current signal that has passed through the first frequency remover and includes the measurement signal.

(4)

The detecting device according to any of the above-described (1) to (3), further including a separator configured to be connected to a side to which a load on an opposite side to at least the coil across the resonant circuit is connected, and electrically separate the load from the resonant circuit when the detecting section measures the Q-factor.

(5)

The detecting device according to any of the above-described (1) to (4), further including a power storage configured to be charged with at least power consumed in measurement of the Q-factor in the detecting section by using the power transmission signal received by the coil from the external, wherein the detecting section measures the Q-factor by using the power stored in the power storage in a period when connection between the resonant circuit and the load is set off.

(6)

The detecting device according to any of the above-described (3) to (5), further including a second frequency remover configured to be connected to a side to which a load on an opposite side to at least the coil across the resonant circuit is connected, and allow passage of the alternating-current signal with the first frequency, the second frequency remover not allowing passage of at least the alternating-current signal with the second frequency.

(7)
The detecting device according to any of the above-described (3) to (6), wherein
the resonant frequency adjuster includes at least either a capacitor or a coil and is connected between the resonant circuit and the first frequency remover.

(8)
The detecting device according to any of the above-described (3) to (7), further including
a determining section configured to compare the Q-factor obtained by the Q-factor measuring section with a reference value set in advance to determine a state of electromagnetic coupling between the coil and the external.

(9)
The detecting device according to the above-described (8), wherein
the state of electromagnetic coupling between the coil and the external is whether or not a conductor near the coil or a circuit including any coil exists.

(10)
The detecting device according to any of the above-described (3) to (9), wherein
the Q-factor measuring section acquires a first voltage applied between both ends of the coil configuring the resonant circuit and the resonant frequency adjuster and a second voltage applied between both ends of the coil from the alternating-current signal that has passed through the first frequency remover, and calculates the Q-factor from a ratio between the first voltage and the second voltage.

(11)
The detecting device according to any of the above-described (3) to (10), wherein
the Q-factor measuring section calculates the Q-factor by using a half width method in which the Q-factor is obtained from a band corresponding to $\sqrt{2}$ times an absolute value of impedance of a series resonant circuit including at least the coil at resonant frequency.

(12)
The detecting device according to any of the above-described (3) to (11), wherein
the Q-factor measuring section calculates the Q-factor by using a half width method in which the Q-factor is obtained from a band corresponding to $1/\sqrt{2}$ times an absolute value of impedance of a parallel resonant circuit including at least the coil at resonant frequency.

(13)
The detecting device according to any of the above-described (3) to (11), further including
a communication section configured to transmit the Q-factor measured by the detecting section to a power transmission side of the power transmission signal.

(14)
A power receiving device including:
a coil configured to be used to receive power from an external;
a resonant circuit configured to include at least the coil; and
a detecting section configured to superimpose a measurement signal for measuring a Q-factor of the resonant circuit on a power transmission signal transmitted to the coil in a contactless manner and remove the power transmission signal from an alternating-current signal obtained by superimposing the measurement signal on the power transmission signal, the detecting section measuring the Q-factor by using the alternating-current signal from which the power transmission signal is removed.

(15)
The power receiving device according to the above-described (14), wherein
the detecting section includes
a resonant frequency adjuster that is connected to the resonant circuit and is to change resonant frequency of the resonant circuit from a first frequency to a second frequency different from the first frequency,
a first frequency remover that does not allow passage of an alternating-current signal with the first frequency and allows passage of at least an alternating-current signal with the second frequency, and
a Q-factor measuring section that calculates the Q-factor by using the alternating-current signal that has passed through the first frequency remover and includes the measurement signal.

(16)
A contactless power transmission system including:
a power transmitting device that wirelessly transmits power; and
a power receiving device that receives power from the power transmitting device,
wherein the power receiving device includes
a coil configured to be used to receive power from an external,
a resonant circuit configured to include at least the coil, and
a detecting section configured to superimpose a measurement signal for measuring a Q-factor of the resonant circuit on a power transmission signal transmitted to the coil in a contactless manner and remove the power transmission signal from an alternating-current signal obtained by superimposing the measurement signal on the power transmission signal, the detecting section measuring the Q-factor by using the alternating-current signal from which the power transmission signal is removed.

(17)
The contactless power transmission system according to (16), wherein
the detecting section includes
a resonant frequency adjuster that is connected to the resonant circuit and is to change resonant frequency of the resonant circuit from a first frequency to a second frequency different from the first frequency,
a first frequency remover that does not allow passage of an alternating-current signal with the first frequency and allows passage of at least an alternating-current signal with the second frequency, and
a Q-factor measuring section that calculates the Q-factor by using the alternating-current signal that has passed through the first frequency remover and includes the measurement signal.

(18)
A detecting method including:
superimposing a measurement signal for measuring a Q-factor of a resonant circuit including at least a coil on a power transmission signal transmitted to the coil in a contactless manner by a detecting section included in a detecting device;
removing the power transmission signal from an alternating-current signal obtained by superimposing the measurement signal on the power transmission signal; and
measuring the Q-factor by using the alternating-current signal from which the power transmission signal is removed.

(19)
The detecting method according to the above-described (18), wherein the power transmission signal is an alternating-current signal with a first frequency and the measurement signal is an alternating-current signal with a second frequency different from the first frequency, and a resonant frequency adjuster included in the detecting section is connected to the resonant circuit to change resonant frequency of the resonant circuit from the first frequency to the second frequency.

The series of processing in the above-described embodiment examples can be executed by hardware and can also be executed by software. In the case of executing the series of processing by software, it can be executed by a computer in which a program configuring the software is incorporated in dedicated hardware or a computer in which a program for executing various kinds of functions is installed. For example, it can be executed by installing a program configuring the desired software in e.g. a general-purpose personal computer.

A recording medium in which the program code of software to realize the functions of the above-described embodiment is recorded may be supplied to a system or a device. Furthermore, it is obvious that the functions are realized also through reading and running of the program code stored in the recording medium by a computer (or control device such as a CPU (central processing unit)) of the system or the device.

As the recording medium for supplying the program code in this case, e.g. the following media can be used: flexible disc, hard disc, optical disc, magneto-optical disc, CD-ROM, CD-R, magnetic tape, non-volatile memory card, and ROM.

Furthermore, the functions of the above-described embodiment are realized by executing the program code read out by the computer. In addition, an OS (operating system) or the like operating on the computer executes part or all of actual processing based on an instruction of this program code. The case in which the functions of the above-described embodiment are realized by this processing is also included.

In the present specification, the processing steps that describe time-series processing encompass not only processing executed in a time-series manner along the described order but also processing that is not necessarily processed in a time-series manner but executed in parallel or individually (e.g. parallel processing or processing by an object).

It is obvious that the present disclosure is not limited to the above-described respective embodiments and other various modification examples and application examples can be employed without departing from the gist set forth in the scope of claims.

Specifically, the examples of the above-described respective embodiments are preferred specific examples of the present disclosure and therefore are given various limits that are technically preferable. However, the technical scope of the present disclosure is not limited to these modes unless a description to the effect that the present disclosure is limited particularly exists in the respective explanations. For example, materials used, the amounts of use thereof, processing times, processing orders, numerical conditions of the respective parameters, etc. employed in the above description are merely preferred examples, and dimensions, shapes, and arrangement relationships in the respective drawings used for the description are also schematic.

The present disclosure contains subject matter related to that disclosed in Japanese Priority Patent Application JP 2011-261816 filed in the Japan Patent Office on Nov. 30, 2011, the entire content of which is hereby incorporated by reference.

What is claimed is:

1. A detecting device comprising:
   a coil configured that electromagnetically couples to an external device;
   a resonant circuit that includes at least the coil; and
   a detecting section with circuitry that superimposes a measurement signal for measuring a Q-factor of the resonant circuit on a power transmission signal transmitted to the coil in a contactless manner and removes the power transmission signal from an alternating-current signal obtained by superimposing the measurement signal on the power transmission signal, the detecting section measuring the Q-factor by using the alternating-current signal from which the power transmission signal is removed.

2. The detecting device according to claim 1, wherein the power transmission signal is an alternating-current signal with a first frequency and the measurement signal is an alternating-current signal with a second frequency different from the first frequency.

3. The detecting device according to claim 2, wherein the detecting section includes:
   a resonant frequency adjuster that is connected to the resonant circuit and is to change resonant frequency of the resonant circuit from the first frequency to the second frequency,
   a first frequency remover that does not allow passage of the alternating-current signal with the first frequency and allows passage of at least the alternating-current signal with the second frequency, and
   a Q-factor measuring section that calculates the Q-factor by using the alternating-current signal that has passed through the first frequency remover and includes the measurement signal.

4. The detecting device according to claim 3, further comprising a separator configured to be connected to a side to which a load on an opposite side to at least the coil across the resonant circuit is connected, and electrically separate the load from the resonant circuit when the detecting section measures the Q-factor.

5. The detecting device according to claim 4, further comprising
   a power storage device that is charged with at least power consumed in measurement of the Q-factor in the detecting section by using the power transmission signal received by the coil from the external device,
   wherein the detecting section measures the Q-factor by using the power stored in the power storage in a period when connection between the resonant circuit and the load is set off.

6. The detecting device according to claim 3, further comprising a second frequency remover connected to a side to which a load on an opposite side to at least the coil across the resonant circuit is connected, and that allows passage of the alternating-current signal with the first frequency, the second frequency remover not allowing passage of at least the alternating-current signal with the second frequency.

7. The detecting device according to claim 3, wherein the resonant frequency adjuster includes at least either a capacitor or a coil and is connected between the resonant circuit and the first frequency remover.

8. The detecting device according to claim 3, further comprising a determining section with circuitry that compares the Q-factor obtained by the Q-factor measuring section with a reference value set in advance to determine a state of electromagnetic coupling between the coil and the external device.

9. The detecting device according to claim 8, wherein the state of electromagnetic coupling between the coil and the external device is whether or not a conductor near the coil or a circuit including any coil exists.

10. The detecting device according to claim 3, wherein the Q-factor measuring section acquires a first voltage applied between both ends of the coil configuring the resonant circuit and the resonant frequency adjuster and a second voltage applied between both ends of the coil from the alternating-current signal that has passed through the first frequency remover, and calculates the Q-factor from a ratio between the first voltage and the second voltage.

11. The detecting device according to claim 3, wherein the Q-factor measuring section calculates the Q-factor by using a half width method in which the Q-factor is obtained from a band corresponding to $\sqrt{2}$ times an absolute value of impedance of a series resonant circuit including at least the coil at resonant frequency.

12. The detecting device according to claim 3, wherein the Q-factor measuring section calculates the Q-factor by using a half width method in which the Q-factor is obtained from a band corresponding to $1/\sqrt{2}$ times an absolute value of impedance of a parallel resonant circuit including at least the coil at resonant frequency.

13. The detecting device according to claim 3, further comprising a communication section that transmits the Q-factor measured by the detecting section to a power transmission side of the power transmission signal.

14. A power receiving device comprising:
a coil that can receive power from an external device;
a resonant circuit that includes at least the coil; and
a detecting section with circuitry that superimposes a measurement signal for measuring a Q-factor of the resonant circuit on a power transmission signal transmitted to the coil in a contactless manner and removes the power transmission signal from an alternating-current signal obtained by superimposing the measurement signal on the power transmission signal, the detecting section measuring the Q-factor by using the alternating-current signal from which the power transmission signal is removed.

15. The power receiving device according to claim 14, wherein the detecting section includes:
a resonant frequency adjuster that is connected to the resonant circuit and changes resonant frequency of the resonant circuit from a first frequency to a second frequency different from the first frequency,
a first frequency remover that does not allow passage of an alternating-current signal with the first frequency and allows passage of at least an alternating-current signal with the second frequency, and
a Q-factor measuring section that calculates the Q-factor by using the alternating-current signal that has passed through the first frequency remover and includes the measurement signal.

16. A contactless power transmission system comprising:
a power transmitting device that wirelessly transmits power; and
a power receiving device that receives power from the power transmitting device,
wherein the power receiving device includes
a coil that can be used to receive power from an external device,
a resonant circuit configured to include at least the coil, and
a detecting section with circuitry that superimposes a measurement signal for measuring a Q-factor of the resonant circuit on a power transmission signal transmitted to the coil in a contactless manner and removes the power transmission signal from an alternating-current signal obtained by superimposing the measurement signal on the power transmission signal, the detecting section measuring the Q-factor by using the alternating-current signal from which the power transmission signal is removed.

17. The contactless power transmission system according to claim 16, wherein the detecting section includes
a resonant frequency adjuster that is connected to the resonant circuit and is to change resonant frequency of the resonant circuit from a first frequency to a second frequency different from the first frequency,
a first frequency remover that does not allow passage of an alternating-current signal with the first frequency and allows passage of at least an alternating-current signal with the second frequency, and
a Q-factor measuring section that calculates the Q-factor by using the alternating-current signal that has passed through the first frequency remover and includes the measurement signal.

18. A detecting method comprising:
superimposing a measurement signal for measuring a Q-factor of a resonant circuit including at least a coil on a power transmission signal transmitted to the coil in a contactless manner by a detecting section included in a detecting device;
removing the power transmission signal from an alternating-current signal obtained by superimposing the measurement signal on the power transmission signal; and
measuring the Q-factor by using the alternating-current signal from which the power transmission signal is removed.

19. The detecting method according to claim 18, wherein the power transmission signal is an alternating-current signal with a first frequency and the measurement signal is an alternating-current signal with a second frequency different from the first frequency, and
a resonant frequency adjuster included in the detecting section is connected to the resonant circuit to change resonant frequency of the resonant circuit from the first frequency to the second frequency.

* * * * *